US010804496B2

(12) United States Patent
Hosono et al.

(10) Patent No.: US 10,804,496 B2
(45) Date of Patent: Oct. 13, 2020

(54) DISPLAY PANEL, DISPLAY DEVICE, AND DISPLAY PANEL MANUFACTURING METHOD

(71) Applicant: JOLED INC., Tokyo (JP)

(72) Inventors: Nobuto Hosono, Hyogo (JP); Takuya Tsujisawa, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/395,702

(22) Filed: Apr. 26, 2019

(65) Prior Publication Data

US 2019/0334125 A1 Oct. 31, 2019

(30) Foreign Application Priority Data

Apr. 27, 2018 (JP) ................... 2018-086954

(51) Int. Cl.
 *H01L 51/52* (2006.01)
 *H01L 27/32* (2006.01)
 *H01L 51/56* (2006.01)

(52) U.S. Cl.
 CPC ...... *H01L 51/5259* (2013.01); *H01L 27/3244* (2013.01); *H01L 51/5246* (2013.01); *H01L 51/56* (2013.01); *H01L 2227/323* (2013.01)

(58) Field of Classification Search
 CPC . H01L 51/5259; H01L 51/5246; H01L 51/56; H01L 27/3244
 USPC .......................................................... 257/40
 See application file for complete search history.

(56) References Cited

U.S. PATENT DOCUMENTS

| 2004/0041753 A1* | 3/2004 | Nakanishi | H01L 27/3211 345/76 |
| 2004/0124770 A1* | 7/2004 | Hayashi | H01L 51/5253 313/506 |
| 2005/0116620 A1* | 6/2005 | Kobayashi | H01L 51/5271 313/503 |
| 2006/0208657 A1* | 9/2006 | Hara | G09G 3/3233 315/169.3 |
| 2009/0039778 A1 | 2/2009 | Tomita | |

FOREIGN PATENT DOCUMENTS

JP 2009-043499 2/2009

\* cited by examiner

*Primary Examiner* — Igwe U Anya
(74) *Attorney, Agent, or Firm* — Greenblum & Bernstein, P.L.C.

(57) ABSTRACT

A display panel includes: a substrate; a light emitting element array that is disposed above the substrate in an image display region; a peripheral electrode that is disposed above the substrate in a peripheral region, the peripheral region being located outside the image display region in plan view; a lyophilic insulating layer that is disposed on the peripheral electrode; and a peripheral bank that includes a liquid-repellent resin material including fluorine, and has an outer edge that overlaps the peripheral electrode in the peripheral region in plan view. The lyophilic insulating layer includes a resin material having a lower percentage of fluorine than the peripheral bank. At least a corner part of a bottom surface of the peripheral bank is disposed on the lyophilic insulating layer.

13 Claims, 12 Drawing Sheets

DISPLAY PANEL, DISPLAY DEVICE, AND DISPLAY PANEL MANUFACTURING METHOD

This application claims priority to Japanese Patent Application No. 2018-086954 filed Apr. 27, 2018, the contents of which are hereby incorporated by reference in their entirety.

BACKGROUND OF DISCLOSURE

Technical Field

The present disclosure relates to display panels that use electroluminescence (EL) elements that make use of electroluminescence, and display devices using the same.

Description of Related Art

Recently, organic EL display panels in which organic EL elements are arranged in a matrix on a substrate are being realized as display panels used in display devices such as digital televisions.

In such organic EL display panels, light emitting layers of organic EL elements of are typically partitioned from adjacent organic EL elements by an insulating layer including an insulating material. Each organic EL element has a configuration in which a functional film such as a light emitting layer containing an organic light emitting material is disposed between an electrode pair of an anode and a cathode, and when driven, a voltage is applied between the electrode pair and light is emitted through recombination of holes injected to the light emitting layer from the anode and electrons injected to the light emitting layer from the cathode.

Recently, as display devices have increased in size, a wet process has been proposed as an efficient method of forming a functional film, in which ink containing a functional material is applied based on a method such as an inkjet method. A wet process has merit in that positional precision when separately applying functional films does not depend on substrate size, and therefore the technical barrier to increasing display device size is relatively low. An organic EL display panel formed by the wet process typically includes a bank disposed on a substrate and light emitting layers formed in a region partitioned by the bank.

Examples of bank arrangement are as follows. One is a pixel bank structure in which banks are arranged in a lattice form to partition a region for each light emitting unit. The other is a line bank structure in which banks each extending in one direction are arranged to partition a region for each column of light emitting units arranged in the one direction (see Japanese Patent Application Publication No. 2009-43499). In such a line bank structure, a liquid-repellent material is used for banks or a treatment for adding liquid-repellency to surfaces of banks is performed in order to prevent for example color mixture caused by ink spread beyond the banks.

SUMMARY

The present disclosure includes a display panel in which a bank disposed on an electrode in a peripheral region is prevented from separating.

A display panel pertaining to at least one embodiment of the present disclosure is a display panel including: a substrate; a light emitting element array that is disposed above the substrate in an image display region; a peripheral electrode that is disposed above the substrate in a peripheral region, the peripheral region being located outside the image display region in plan view; a lyophilic insulating layer that is disposed on the peripheral electrode; and a peripheral bank that includes a liquid-repellent resin material including fluorine, and has an outer edge that overlaps the peripheral electrode in the peripheral region in plan view. The lyophilic insulating layer includes a resin material having a lower percentage of fluorine than the peripheral bank. At least a corner part of a bottom surface of the peripheral bank is disposed on the lyophilic insulating layer.

According to a display panel pertaining to at least aspect of the present disclosure, separation of a peripheral bank is prevented and this reduces influence of a peripheral bank forming process on display panels, thereby achieving display panels with a stable quality.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

DETAILED DESCRIPTION

Figure 1:
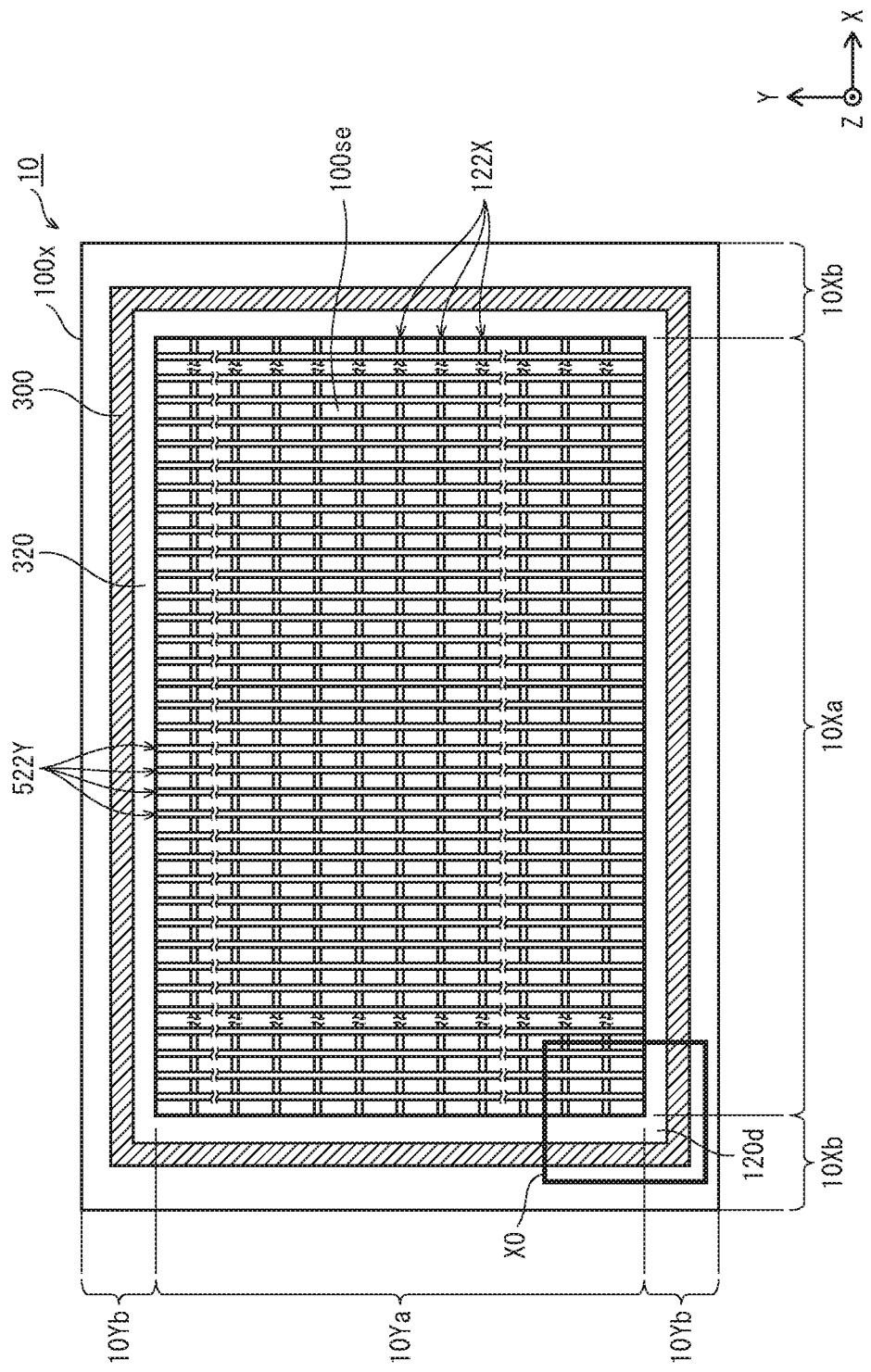
FIG. 1 is a schematic plan view of configuration of a display panel 10 pertaining to at least one embodiment.

According to an application method of forming light emitting layers, functional layers, and the like, an ink in which material has been dissolved is applied to gaps between banks. As described above, liquid-repellency is added to top portions and side portions of the banks in order to prevent ink spread beyond the banks. Ink is applied to a region that is to be an image display region where light emitting elements are formed. Accordingly, it is unfavorable that the ink leaks into a region that is to be a peripheral region located outside the image display region from a viewpoint of control on film thickness of light emitting layers and functional layers and a viewpoint of formation of the peripheral region. Thus, a peripheral bank should preferably be formed in order to partition between the image display region and the peripheral region, which is located outside the image display region. Also, the peripheral bank should preferably have liquid-repellency in order to prevent ink spread beyond the peripheral bank.

By the way, a peripheral electrode surrounding the image display region should preferably be formed in the peripheral region. In light emitting elements of a so-called top emission type, a common electrode serving as a counter electrode is required to be light transmissive, and accordingly usually includes conductive oxide such as indium tin oxide (ITO) and indium zinc oxide (IZO). However, such a conductive oxide has a high sheet resistance of compared to metal. Accordingly, in especially large-sized display panels, a metal material should preferably be used for forming a peripheral electrode that is to be disposed in a peripheral region and auxiliary electrodes that are to be provided in gaps between light emitting elements in an image display region. Particularly, the peripheral electrode usually doubles as an electrode for feeding electrical power to the auxiliary electrodes, and accordingly should preferably have a large surface. On the other hand, in the case where the peripheral electrode and the peripheral bank are separated from each other, an area of the peripheral region increases and this decreases a proportion of the image display region in the display panel. Also, pixel electrodes are required to be light-reflective and accordingly usually include a metal material. Thus, the use of the same material is possible for forming pixel electrodes and a peripheral electrode. In view of this, it is effective that a single metal layer is patterned to collectively form pixel electrodes and a peripheral electrode in terms of simplification of manufacturing processes, compared to the case where a process of forming a peripheral electrode and a process of forming pixel electrodes are individually performed. Here, a distance between outermost ones of the pixel electrodes and the peripheral electrode is set to approximately a distance between the pixel electrodes, and the inner edge of the peripheral electrode is covered with the peripheral bank, which is an insulating layer. This facilitates to set a minimum space between the image display region and the peripheral region.

However, the inventors found the following problem in the above configuration. A peripheral electrode should preferably include a metal material having a low sheet resistance and a high reflectivity for visible light, such as aluminum and alloy of aluminum. In contrast, at least a surface of a peripheral bank should preferably be liquid-repellent, and accordingly includes fluorine compound. Due to this, in the case where the peripheral bank is disposed directly on the peripheral electrode, the fluorine compound which is included in the peripheral bank sometimes affects the peripheral electrode. Particularly, in the case where the peripheral bank includes a photosensitive resin material containing fluorine compound (so-called photoresist), the peripheral electrode is exposed to a developer containing fluorine compound during a peripheral bank developing process. This results in elution of a surface part of the peripheral electrode exposed to the developer due to the fluorine compound. In the case where the surface part of the peripheral electrode elutes at a contact interface between the peripheral bank and the peripheral electrode, the adhesion between the peripheral bank and the peripheral electrode decreases, and thus the peripheral bank might separate from a substrate.

Furthermore, separation between a bank and a peripheral electrode such as the above case might occur in other cases, such as a case where a frame-shaped bank is disposed on part of a peripheral electrode in order to constitute dummy pixels. In such a case, a direct contact between the frame-shaped bank and the peripheral electrode might result in separation of the frame-shaped bank likewise. Moreover, in the case where an isolated bank that is linear or curved is disposed on a peripheral electrode, a direct contact between the isolated bank and the peripheral electrode might result in separation of the isolated bank likewise.

Furthermore, in the case where a peripheral bank or the like includes not so-called photoresist but non-photosensitive resin, a contact interface between the peripheral bank and a peripheral electrode is exposed to an etching gas, an etching solution, or the like during a patterning process.

Thus, a similar problem inevitable occurs when a peripheral bank including fluorine is in direct contact with an electrode.

In view of the above, the inventors have made studies on a configuration for improving the adhesion between a peripheral electrode and a liquid-repellent bank disposed on the peripheral electrode in a display panel, and as a result have conceived of at least one aspect of the present disclosure.

A display panel pertaining to at least one embodiment of the present disclosure is a display panel including: a substrate; a light emitting element array that is disposed above the substrate in an image display region; a peripheral electrode that is disposed above the substrate in a peripheral region, the peripheral region being located outside the image display region in plan view; a lyophilic insulating layer that is disposed on the peripheral electrode; and a peripheral bank that includes a liquid-repellent resin material including fluorine, and has an outer edge that overlaps the peripheral electrode in the peripheral region in plan view. The lyophilic insulating layer includes a resin material having a lower percentage of fluorine than the peripheral bank. At least a corner part of a bottom surface of the peripheral bank is disposed on the lyophilic insulating layer.

According to a display panel pertaining to at least aspect of the present disclosure, separation of a peripheral bank is prevented and this reduces influence of a peripheral bank forming process on display panels, thereby achieving display panels with a stable quality.

A display panel pertaining to at least one embodiment of the present disclosure is a display panel including: a substrate; a light emitting element array that is disposed above the substrate in an image display region; a peripheral electrode that is disposed above the substrate in a peripheral region, the peripheral region being located outside the image display region in plan view; a lyophilic insulating layer that is disposed on the peripheral electrode; and a peripheral bank that includes a liquid-repellent resin material including fluorine. The lyophilic insulating layer includes a resin material having a lower percentage of fluorine than the peripheral bank. A part of an outer edge of the peripheral bank overlaps the peripheral electrode in the peripheral region in plan view. At least the part of the outer edge of the peripheral bank is disposed on the lyophilic insulating layer.

According to a display panel pertaining to at least aspect of the present disclosure, separation of a peripheral bank is prevented and this reduces influence of a peripheral bank forming process on a display panel, thereby achieving display panels with a stable quality.

According to at least one embodiment of the display panel, the resin material of the lyophilic insulating layer includes no fluorine.

With the above configuration, the lyophilic insulating layer exerts no influence on the peripheral region, thereby achieving display panels with a more stable quality.

According to at least one embodiment of the display panel, the peripheral bank partitions between the image display region and the peripheral region.

With the above configuration, the peripheral bank, which is liquid-repellent, prevents material of the light emitting element array from leaking into the peripheral region.

According to at least one embodiment of the display panel, an outer edge of the lyophilic insulating layer is located outside the outer edge of the peripheral bank in plan view.

With the above configuration, the peripheral bank is further strongly prevented from exerting an influence on the peripheral electrode, thereby achieving display panels with a stable quality.

According to at least one embodiment of the display panel, an outer edge of the lyophilic insulating layer coincides with the outer edge of the peripheral bank in plan view.

With the above configuration, area minimization of the lyophilic insulating layer is possible.

According to at least one embodiment of the display panel, the light emitting element array includes light emitting elements that include pixel electrodes, a functional layer, and a common electrode. The peripheral electrode and the pixel electrodes include a same material.

With the above configuration, simultaneous formation of the peripheral electrode and the pixel electrodes is possible, thereby manufacturing display panels in a more convenient and efficient manner.

According to at least one embodiment of the display panel, the peripheral electrode is electrically connected with the common electrode.

With the above configuration, efficient electrical power feeding while suppressing voltage decrease is possible.

According to at least one embodiment of the display panel, the light emitting element array includes: light emitting elements that are disposed in a matrix of rows and columns; column banks that include a liquid-repellent resin material, extend in a column direction, and partition between the light emitting elements in a row direction; and row banks that include a resin material having a lower liquid repellency than the column banks, and partition between the light emitting elements in the column direction. The lyophilic insulating layer and the row banks include a same material.

With the above configuration, simultaneous formation of the lyophilic insulating layer and the row banks is possible, thereby manufacturing display panels in a more convenient and efficient manner.

According to at least one embodiment of the display panel, the peripheral bank and the column banks include a same material.

With the above configuration, simultaneous formation of the peripheral bank and the column banks is possible, thereby manufacturing display panels in a more convenient and efficient manner.

A display device pertaining to at least one embodiment of the present disclosure is a display device including a display panel pertaining to at least one embodiment of the present disclosure.

Also, a method of manufacturing a display panel pertaining to at least one embodiment of the present disclosure is a method of manufacturing a display panel having an image display region and a peripheral region. The peripheral region is located outside the image display region in plan view. The method includes forming pixel electrodes above a substrate in a range corresponding to the image display region. The method further includes forming a peripheral electrode above the substrate in a range corresponding to the peripheral region. The method further includes forming a lyophilic insulating layer and row banks by using a photosensitive resin material. The lyophilic insulating layer covers at least an inner edge of the peripheral electrode, and the row banks partition between the pixel electrodes in a column direction. The method further includes forming a peripheral bank and column banks by using a photosensitive resin material having a higher percentage of fluorine than the photosensitive resin material of the lyophilic insulating layer. At least a corner part of a bottom surface of the peripheral bank is disposed on the lyophilic insulating layer, and the column banks partition between the pixel electrodes in a row direction. The method further includes forming a functional layer above the pixel electrodes. The method further includes forming a common electrode above the functional layer and the peripheral electrode.

Moreover, a method of manufacturing a display panel pertaining to at least one embodiment of the present disclosure is a method of manufacturing a display panel having an image display region and a peripheral region. The peripheral region is located outside the image display region in plan view. The method includes forming pixel electrodes above a substrate in a range corresponding to the image display region. The method further includes forming a peripheral electrode above the substrate in a range corresponding to the peripheral region. The method further includes forming a lyophilic insulating layer and row banks by using a photosensitive resin material. The lyophilic insulating layer covers at least an inner edge of the peripheral electrode, and the row banks partition between the pixel electrodes in a column direction. The method further includes forming a peripheral bank and column banks by using a photosensitive resin material having a higher percentage of fluorine than the photosensitive resin material of the lyophilic insulating layer. An outer edge of the peripheral bank is located inside an outer edge of the lyophilic insulating layer, and the column banks partition between the pixel electrodes in a row direction. The method further includes forming a functional layer above the pixel electrodes. The method further includes forming a common electrode above the functional layer and the peripheral electrode.

A display panel manufactured by a display panel manufacturing method pertaining to at least one embodiment of the present disclosure includes a peripheral bank that exercises no influence on a peripheral electrode, and thus has an improved adhesion between the peripheral bank and the peripheral electrode. This helps to manufacture display panels in a more convenient and efficient manner by the display panel manufacturing method.

1. Overall Configuration of Display Panel 10

1.1 Outline

An organic light emitting display panel 10 (hereinafter, display panel 10) as an embodiment of a display panel pertaining to at least one embodiment is described with reference to the drawings. The drawings are schematic diagrams and actual scale may differ.

FIG. 1 is a schematic plan view of the display panel 10 pertaining to at least one embodiment.

The display panel 10 is an organic EL display panel that uses electroluminescence of an organic compound, and has light emitting elements (organic EL elements 100), which form pixels, disposed in a matrix of rows and columns on a substrate 100x (thin film transistor (TFT) substrate) on which TFTs are disposed. The display panel 10 has a top-emission configuration, emitting light from an upper surface. Here, in the present disclosure, the X direction, the Y direction, and the Z direction in FIG. 1 correspond to the row direction, the column direction, and the thickness direction of the display panel 10, respectively.

In FIG. 1, the display panel 10 is composed of an image display region 10a in which the organic EL elements 100 are arranged in the matrix of rows and columns and a peripheral region 10b surroundings the image display region 10a. The image display region 10a is partitioned in the matrix by column banks 522Y partitioning the organic EL elements 100 in the row direction and row banks 122X partitioning the organic EL elements 100 in the column direction. A peripheral bank 320 is formed at a boundary between the image display region 10a and the peripheral region 10b so as to surround the image display region 10a. A peripheral electrode 300 is formed in the peripheral region 10b so as to surround the peripheral bank 320. Further, though not in FIG. 1, a sealing member is formed so as to surround the peripheral electrode 300.

1.2 Configuration of Components Near Peripheral Bank 320

Figure 2:
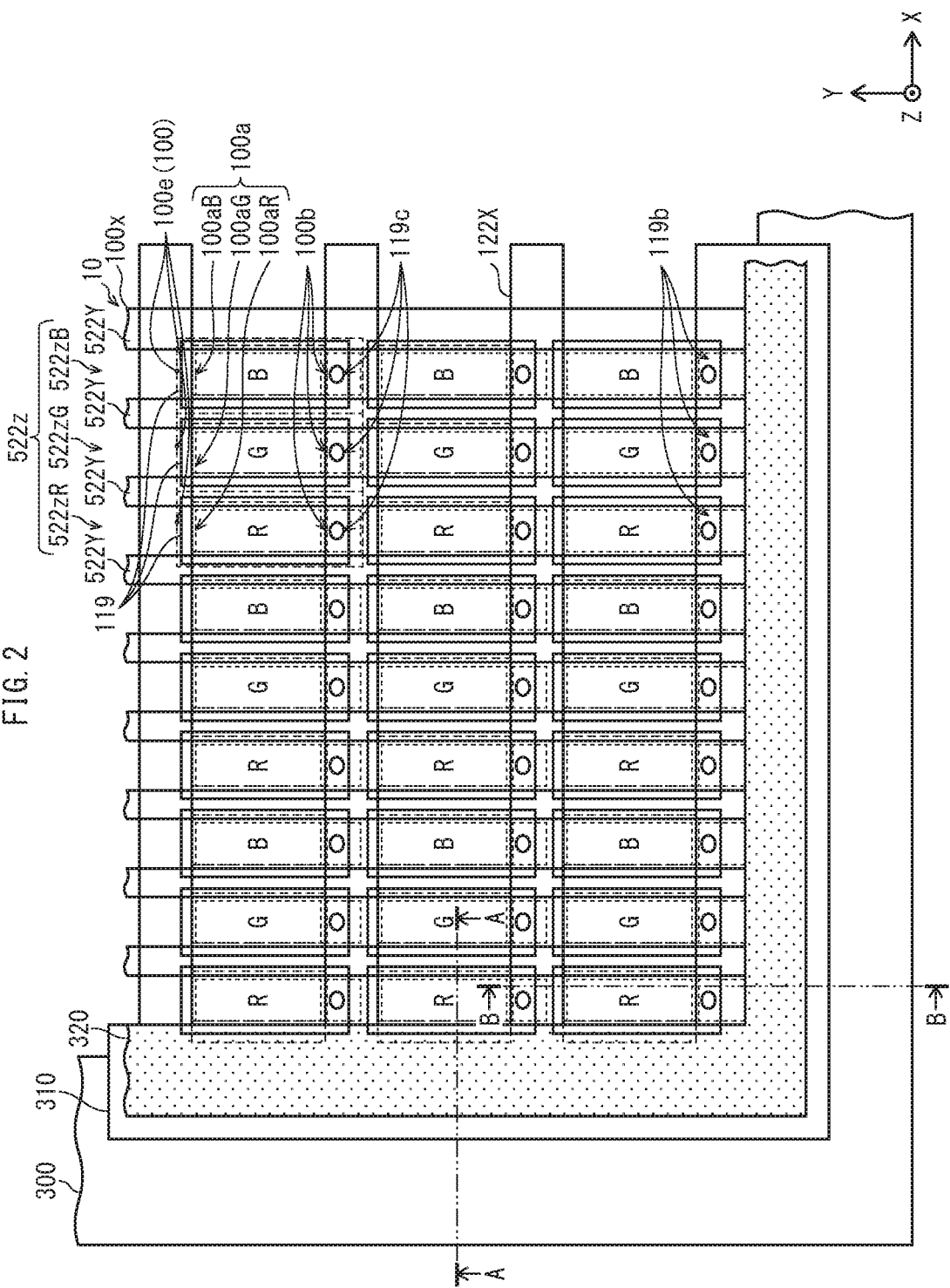
FIG. 2 is a schematic enlarged plan view of a portion X0 in FIG. 1, indicating the configuration of the display panel 10 pertaining to at least one embodiment.

FIG. 2 is an enlarged plan view of a portion X0 in FIG. 1 pertaining to at least one embodiment.

In the image display region 10a of the display panel 10, unit pixels 100e corresponding to the organic EL display elements 100 are arranged in a matrix.

In each of the unit pixels 100e, three self light emitting regions 100a are formed, which are regions that emit light via an organic compound, namely, a self red light emitting region 100aR, a self green light emitting region 100aG, and a self blue light emitting region 100aB (hereinafter, where a distinction between 100aR, 100aG, and 100aB is not necessary, 100a is used). That is, three sub pixels 100se corresponding to self light emitting regions 100aR, 100aG, and 100aB lined up in the row direction in FIG. 2 are one set, and make up one of the unit pixels 100e in a color display.

Further, in FIG. 2, the display panel 10 includes pixel electrodes 119 that are arranged in a matrix on the substrate 100x at predefined intervals in the row and column directions. Each of the pixel electrodes 119 has a rectangular shape in plan view. The pixel electrodes 119 arranged in a matrix correspond to the three self light emitting regions 100aR, 100aG, 100aB lined up in the row direction.

In the display panel 10, shapes of the banks 122 are that of a so-called line-like insulating layer form. The column banks 522Y extend in the column direction (Y direction in FIG. 2) and are lined up in the row direction above regions on the substrate 100x between outer edges in the row direction of two adjacent ones of the pixel electrodes 119 in the row direction.

On the other hand, the row banks 122X extend in the row direction (X direction in FIG. 2) and are lined up in the column direction above regions on the substrate 100x between outer edges in the column direction of two adjacent ones of the pixel electrodes 119 in the column direction. A region in which the row banks 122X are formed becomes a non-self light emitting region 100b, because organic electroluminescence does not occur in light emitting layers 123 above the pixel electrodes 119. Thus, edges in the column direction of the self light emitting regions 100a are defined by edges in the column direction of the row banks 122X.

Where a gap 522z between adjacent ones of the column banks 522Y is defined, a red gap 522zR corresponding to the self light emitting region 100aR, a green gap 522zG corresponding to the self light emitting region 100aG, or a blue gap 522zB corresponding to the self light emitting region 100aB exists (hereinafter, where distinction between gap 522zR, gap 522zG, and gap 522zB is not required, "gap 522z" is used). In the display panel 10, the column banks 522Y and the gaps 522z alternate in the row direction.

Further, in FIG. 2, in the display panel 10, the self light emitting regions 100a and the non-self light emitting regions 100b alternate in the column direction along the gap 522z. In the non-self light emitting region 100b, there is a connecting recess 119c (contact hole) that connects one of the pixel electrodes 119 to a source electrode of a TFT, and a contact region 119b (contact window) on the pixel electrode 119 for electrical connection to the pixel electrode 119.

Further, for one sub pixel 100*se*, the column banks 522Y and the row banks 122X intersect, and the self light emitting region 100*a* is disposed between the row banks 122X in the column direction.

The peripheral electrode 300 is disposed in the peripheral region 10*b*, which surrounds the image display region 10*a*, so as to surround the image display region 10*a*. Also, the peripheral bank 320 is formed at the boundary between the peripheral region 10*b* and the image display region 10*a* so as to surround the image display region 10*a*. The inner edge of the peripheral bank 320 defines the outer edges of the self light emitting regions 100*a* that are located outermost in the image display region 10*a*. Further, the outer edge of the peripheral bank 320 defines the inner edge of the peripheral region 10*b*. Moreover, part of the peripheral bank 320 including the outer edge is located on the peripheral electrode 300, and a lyophilic insulating layer 310 is interposed between at least the outer edge of the peripheral bank 320 and the peripheral electrode 300. In other words, the outer edge of the peripheral bank 320 is out of direct contact with the peripheral electrode 300, and is in close contact with the peripheral electrode 300 via the lyophilic insulating layer 310.

2. Configuration of Components of Display Panel 10

Figure 3A:
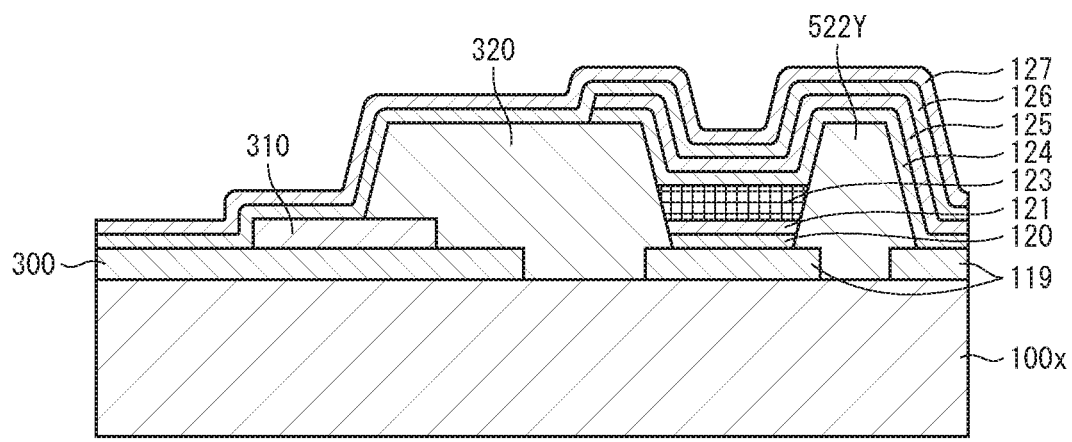
FIGS. 3A and 3B are schematic cross sections respectively taken along a line A-A and a line B-B in FIG. 2, indicating the configuration of the display panel 10 pertaining to at least one embodiment.
Figure 3B:
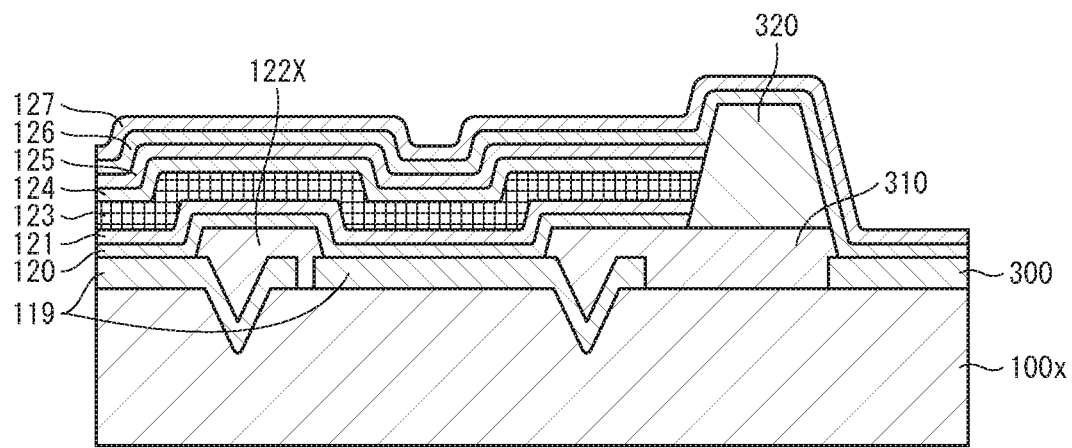

The following explains the configuration of the organic EL elements 100 and the components near the peripheral bank 320 in the display panel 10, with reference to cross-sectional views in FIGS. 3A and 3B. FIG. 3A is a schematic cross section taken along a line A-A in FIG. 2 pertaining to at least one embodiment. FIG. 3B is a schematic cross section taken along a line B-B in FIG. 2 pertaining to at least one embodiment.

The display panel 10 pertaining to at least one embodiment includes the substrate 100*x* (TFT substrate) on which the TFTs are formed in a lower part in the Z-axis direction and organic EL element units are formed thereon.

(1) Substrate 100*x*

The substrate 100*x* includes a base material that is an insulating material, a TFT layer, and an interlayer insulating layer. The TFT layer has drive circuits formed therein for the respective sub pixels 100*se*.

The base material is for example a glass substrate, a quartz substrate, a silicon substrate, a metal substrate including molybdenum sulfide, copper, zinc, aluminum, stainless, magnesium, iron, nickel, gold, silver, or the like, a semiconductor substrate including gallium arsenide or the like, or a plastic substrate. Both thermoplastic resin and thermosetting resin are usable as a plastic material of the base material. The plastic material is for example a single layer of any one type of the following materials or a laminate of any two or more types of the following materials selected so as to be resistant against the process temperature. The materials include polyimide (PI), polyether imide (PEI), polysulfone (PSU), polycarbonate (PC), polyethylene terephthalate (PET), polyethylene naphthalate (PEN), polybutylene terephthalate, thermoplastic elastomer such as styrene elastomer, polyolefin elastomer, and polyurethane elastomer, epoxy resin, unsaturated polyester resin, silicone resin, polyurethane, or copolymer, blend, polymer alloy or the like including such a material as a main component.

The interlayer insulating layer includes a resin material, and is provided for flattening unevenness on an upper surface of the TFT layer. The resin material is for example a positive photosensitive material. Examples of the photosensitive material include acrylic resin, polyimide resin, siloxane resin, and phenol resin.

(1) Pixel Electrodes 119 and Peripheral Electrode 300

On the interlayer insulating layer, which is positioned on the upper surface of the substrate 100*x*, while the pixel electrodes 119 are provided in units of the sub pixels 100*se* in the image display region 10*a*, the peripheral electrode 300, which surrounds the image display region 10*a*, is provided in the peripheral region 10*b*.

The pixel electrodes 119 are provided for supplying carriers to the light emitting layers 123. For example, when functioning as anodes, the pixel electrodes 119 supply holes to the light emitting layers 123. The pixel electrodes 119 are rectangular and plate-like. The pixel electrodes 119 are arranged on the substrate 100*x* with predefined intervals therebetween in the row direction and with predefined intervals therebetween in the column direction in the gaps 522*z*. Also, the connection recesses 119*c* of the pixel electrodes 119, which are recessed towards the substrate 100*x*, are connected with the source electrodes of the TFTs through contact holes which are provided in the upper surface of the substrate 100*x*.

The peripheral electrode 300 is provided for supplying carriers to a common electrode 126 which is described later. For example, when the pixel electrodes 119 function as anodes, the peripheral electrode 300 supplies electron to the common electrode 126 serving as a counter electrode. The peripheral electrode 300 is frame-shaped and plate-like. The peripheral electrode 300 is disposed on the substrate 100*x* at a predefined interval in the row direction and a predefined interval in the column direction from ones of the pixel electrodes 119 that are located outermost in the image display region 10*a*.

The pixel electrodes 119 and the peripheral electrode 300 each include a metal layer including a light-reflective metal material. Specific examples of the light-reflective metal material include silver (Ag), aluminum (Al), alloy of aluminum, molybdenum (Mo), alloy of silver, palladium, and copper (APC), alloy of silver, rubidium, and gold (ARA), alloy of molybdenum and chromium (MoCr), alloy of molybdenum and tungsten (MoW), and alloy of nickel and chromium (NiCr).

In at least one embodiment, the pixel electrodes 119 and the peripheral electrode 300 each have a single-layer structure of a metal layer. Also, in at least one embodiment, the pixel electrodes 119 and the peripheral electrode 300 each have a multi-layer structure including a metal oxide layer, such as an indium tin oxide (ITO) layer and an indium zinc oxide (IZO) layer, layered on a metal layer.

(3) Hole Injection Layers 120 and Hole Transport Layers 121

The hole injection layers 120 are provided on the pixel electrodes 119 in order to promote injection of holes from the pixel electrodes 119 to the light emitting layers 123. Specific examples of material of the hole injection layers 120 include a conductive polymer material such as PEDOT/PSS (mixture of polythiophene and polystyrene sulfonate).

In at least one embodiment, the hole injection layers 120 include oxide of transition metal. Specific examples of transition metal include silver (Ag), molybdenum (Mo), chromium (Cr), vanadium (V), tungsten (W), nickel (Ni), and iridium (Ir). The reason why oxide of transition metal is used is that oxide of transition metal has a plurality of oxidation numbers, and this facilitates hole injection, contributing to reduction in driving voltage. In at least one embodiment, the hole injection layers 120 have a high work function.

The hole transport layers 121 have a function of transporting holes injected from the hole injection layers 120 to the light emitting layers 123. The hole transport layers 121 include an organic material having a high hole mobility in order to efficiently transport holes from the hole injection layers 120 to the light emitting layers 123. The hole transport layers 121 are formed by applying and drying a solution of an organic material. The organic material of the hole transport layers 121 is for example a high-molecular compound such as polyfluorene, polyfluorene derivative, polyallylamine, and polyallylamine derivative.

Also, in at least one embodiment, the hole transport layers 121 includes triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound and styrylamine compound, butadiene compound, polystyrene derivative, hydrazone derivative, triphenylmethane derivative, or tetraphenylbenzene derivative. In at least one embodiment, the hole transport layers 121 include porphyrin compound, aromatic tertiary amine compound, styrylamine compound, or the like. In this case, the hole transport layers 121 are formed by a vacuum deposition method. The material and the manufacturing method of the hole transport layers 121 are not limited to those described above. In at least one embodiment, the hole transport layers 121 is formed by using any material having a hole transport function and any manufacturing method usable for manufacturing the hole transport layers 121.

(4) Banks 122

The banks 122 include an insulator and are formed to cover edges of the pixel electrodes 119, the hole injection layers 120, and the hole transport layers 121. The banks 122 include the column banks 522Y extending in the column direction and arranged along the row direction and the row banks 122X extending in the row direction and arranged along the column direction. In FIG. 2, the column banks 522Y intersect the row banks 122X, forming a lattice shape. Further, upper surfaces of the column banks 522Y are positioned higher than upper surfaces of the row banks 122X.

The row banks 122X each have a line-like shape extending in the row direction, and in cross section taken along the column direction have a tapered trapezoidal shape tapering upwards. The row banks 122X extend in the row direction, perpendicular to the column direction, passing through the column banks 522Y. The upper surfaces of the row banks 122X are positioned lower than the upper surfaces of the column banks 522Y. Thus, the row banks 122X and the column banks 522Y form openings corresponding to the self light emitting regions 100a.

The row banks 122X are for controlling flow in the column direction of ink containing an organic compound that is a material of the light emitting layers 123. Thus, the row banks 122X have a lyophilic property with respect to the ink that is not less than a predefined value. According to this configuration, fluidity of the ink in the column direction is increased to suppress variation of applied ink amount between sub pixels. The pixel electrodes 119 are not exposed in regions other than the self light emitting regions 100a, which are partitioned by the row banks 122X and the column banks 522Y. Regions in which the row banks 122X are present do not emit light and thus do not contribute to luminance.

When an upper limit of film thickness of the row banks 122X is thicker than 2000 nm, wet spreading of the ink is poor, and when 1200 nm or less, wet spreading of the ink is further improved. Further, when a lower limit of film thickness is at least 100 nm, end portions of the pixel electrodes 119 are covered with the banks 122, and the pixel electrodes 119 and the counter electrode 125 can be manufactured at a constant yield without short-circuits. When the lower limit of film thickness is at least 200 nm, short defects are reduced making stable manufacturing possible. In a case in which connecting groove portions are provided in the banks 122, the same applied to film thickness at a bottom of the groove portions.

Accordingly, in at least one embodiment, thickness of the row banks 122X ranges from 100 nm to 2000 nm. In at least one embodiment, thickness of the row banks 122X ranges from 200 nm to 1200 nm. According to at least one embodiment, thickness of the row banks 122X is approximately 1000 nm.

The column banks 522Y block flow of the ink, which contains the organic compound that is the material of the light emitting layers 123, in the row direction to define row direction outer edges of the light emitting layers 123. The column banks 522Y each have a line-like shape extending in the column direction, and in cross section taken along the row direction have a tapered trapezoidal shape tapering upwards.

The column banks 522Y define outer edges in the row direction of the self light emitting region 100a of each of the sub pixels 100se. Thus, the column banks 522Y have liquid repellency with respect to the ink that is not less than a predefined value.

In at least one embodiment, the thickness of the column banks 522Y ranges from 100 nm to 5000 nm. In at least one embodiment, the thickness of the column banks 522Y range from 200 nm to 3000 nm. According to at least one embodiment, the thickness of the column banks 522Y is approximately 2000 nm.

In order to help prevent current leakage in the thickness direction (Z direction) between outer edges of the pixel electrodes 119 and the common electrode 126, the row banks 122Y and the column banks 522Y have an insulation property with a volume resistivity of $1 \times 10^6 \Omega$ cm or more. Thus, as described later, the row banks 122Y and the column banks 522Y are configured to include a predefined insulating material.

The column banks 522Y include a base material including an insulating resin material to which a liquid-repellent surfactant such as fluorine compound has been added. Examples of the base material, which includes an insulating resin material, include a positive photosensitive material such as acrylic resin, polyimide resin, siloxane resin, and phenol resin. The base material is not limited to a positive photosensitive material. In at least one embodiment, a negative photosensitive material is for example used for the base material. Also, in at least one embodiment, a non-photosensitive material is for example used for the base material.

The row banks 122X include a resin material such as a positive photosensitive material such as acrylic resin, polyimide resin, siloxane resin, and phenol resin. The resin material is not limited to a positive photosensitive material. In at least one embodiment, a negative photosensitive material is for example used for the resin material. Also, in at least one embodiment, a non-photosensitive material is for example used for the resin material.

(5) Lyophilic Insulating Layer 310 and Peripheral Bank 320

The peripheral bank 320 is formed so as to surround the image display region 10a to define the boundary between the image display region 10a and the peripheral region 10b. The peripheral bank 320 is frame-shaped along the outer edge of the image display region 10*a*, and in cross section taken along a direction perpendicular to an extension direction, has a tapered trapezoidal shape tapering upwards.

The peripheral bank 320 is provided in order to prevent flow of an ink containing an organic compound that is a material of the light emitting layers 123 into the peripheral region 10*b*. Thus, the peripheral bank 320 has liquid repellency with respect to the ink that is not less than the predefined value, as well as the column banks 522Y have. Also, in at least one embodiment, the peripheral bank 320 has a thickness that is equivalent to or greater than the thickness of the column banks 522Y.

The peripheral bank 320 includes a base material including an insulating resin material to which a liquid-repellent surfactant such as fluorine compound has been added. Examples of the base material, which includes an insulating resin material, include a positive photosensitive material such as acrylic resin, polyimide resin, siloxane resin, and phenol resin. The base material is not limited to a positive photosensitive material. In at least one embodiment, a negative photosensitive material is for example used for the base material. Also, in at least one embodiment, a non-photosensitive material is for example used for the base material. In at least one embodiment, the peripheral bank 320 includes the same material as the column banks 522Y. Furthermore, in at least one embodiment, integral molding of the peripheral bank 320 and the column banks 522Y is possible.

The lyophilic insulating layer 310 is provided in order to prevent direct contact of at least the outer edge of the peripheral bank 320 with the peripheral electrode 300. The lyophilic insulating layer 310 is frame-shaped, and is located below at least the outer edge of the peripheral bank 320. In cross section taken along a direction perpendicular to an extension direction, the lyophilic insulating layer 310 has a tapered trapezoidal shape tapering upwards.

The lyophilic insulating layer 310 functions as a protective layer protecting the peripheral electrode 300 against liquid-repellent components contained in the material of the peripheral bank 320, specifically against fluorine compound. Thus, the lyophilic insulating layer 310 has a low liquid repellency, and has a lower percentage of fluorine compound than the peripheral bank 320. In at least one embodiment, the lyophilic insulating layer 310 includes no fluorine compound.

The lyophilic insulating layer 310 includes a resin material such as a positive photosensitive material. Specific examples of the photosensitive material include acrylic resin, polyimide resin, siloxane resin, and phenol resin. The resin material is not limited to a positive photosensitive material. In at least one embodiment, a negative photosensitive material is for example used for the resin material. Also, in at least one embodiment, a non-photosensitive material is for example used for the resin material. In at least one embodiment, the lyophilic insulating layer 310 includes the same material as the row banks 122X. Furthermore, in at least one embodiment, integral molding of the lyophilic insulating layer 310 and the row banks 122X is possible.

Note that the percentage of fluorine in the present disclosure indicates the percentage of fluorine on the surfaces of the upper surfaces of the peripheral bank 320, the lyophilic insulating layer 310, the column banks 522Y, and the row banks 122X. Analysis as to whether F ions are on the surfaces is performed for example with use of a TOF-SIMS apparatus. According to this method, Bi is used as primary ions, and secondary ions obtained at approximately 2 nm from the surface are detected in the analysis for measurement of the percentage of fluorine.

(6) Light Emitting Layers 123

The light emitting layers 123 are formed on the hole transport layers 121 inside openings. The light emitting layers 123 each has a function of emitting light of one of the R, G, and B colors owing to recombination of holes and electrons. Publicly-known materials are usable for a material of the light emitting layers 123.

Examples of an organic light emitting material of the light emitting layers 123 include phosphor such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex. Also, in at least one embodiment, the organic light emitting material of the light emitting layers 123 is a known phosphorescent substance such as metal complex such as tris (2-phenylpyridine) iridium. Further, in at least one embodiment, the light emitting layers 123 for example includes a high-molecular compound such as polyfluorene, polyfluorene derivative, polyallylamine, and polyallylamine derivative, or include a mixture of a low-molecular compound and the high-molecular compound.

(7) Electron Transport Layer 124

The electron transport layer 124 is formed on the light emitting layers 123, the row banks 122X, and the column banks 522Y inside the image display region 10*a* in common for the sub pixels 100*se*. The electron transport layer 124 has a function of transporting electrons injected from the common electrode 126 to the light emitting layers 123. The electron transport layer 124 for example include oxadiazole derivative (OXD), triazole derivative (TAZ), or phenanthroline derivative (BCP Bphen).

(8) Electron Injection Layer 125

The electron injection layer 125 is formed on the electron transport layer 124 inside the image display region 10*a* in common for the sub pixels 100*se*, and has a function of promoting electron injection from the common electrode 126 to the light emitting layers 123.

The electron injection layer 125 for example includes an organic material having an electron injection property that is doped with a metal material improving an electron injection property. Here, doping indicates dispersion of metal atoms or metal ions of a metal material into an organic material in a substantially uniform manner, and specifically indicates formation of a single phase including an organic material and a minute amount of a metal material. In at least one embodiment, other phase is not present such as a phase only including a metal material and a phase mainly including a metal material, which are a metal piece, a metal film, or the like. In at least one embodiment, a single phase, which includes an organic material and a minute amount of a metal material, has metal atoms and metal ions at uniform concentrations. In at least one embodiment, the single phase has metal atoms and metal ions that do not cohere together. In at least one embodiment, the metal material is selected from alkali metal or alkaline-earth metal. In at least one embodiment, the metal material is selected from Ba or Li. In at least one embodiment, Ba is selected for the metal material. Also, in at least one embodiment, a doping amount of the metal material in the electron injection layer 125 is 5 wt % to 40 wt %. In at least one embodiment, the doping amount of the metal material is 20 wt %. The organic material having an electron transport property is for example a π-electron low molecular organic material such oxadiazole derivative (OXD), triazole derivative (TAZ), and phenanthroline derivative (BCP, Bphen).

In at least one embodiment, the electron injection layer 125 includes, on the side of the light emitting layer 123, a fluoride layer including metal selected from alkali metal or alkaline-earth metal.

(9) Common Electrode 126

The common electrode 126 is formed on the peripheral electrode 300, the lyophilic insulating layer 310, the peripheral bank 320, and the electron transport layer 124 in common for these components. The common electrode 126 functions as a cathode.

The common electrode 126 is light transmissive and electrically conductive, and includes at least one of a metal layer including a metal material and a metal oxide layer including metal oxide. The metal layer has a film thickness of approximately 1 nm to 50 nm for the purpose of exhibiting light transmissivity. Examples of a material of the metal layer include Ag, Ag alloy mainly containing Ag, Al, and Al alloy mainly containing Al. Examples of Ag alloy include magnesium-silver alloy (MgAg) and indium-silver alloy. Ag basically has a low resistivity. Ag alloy has excellent heat resistance and corrosion resistance. Accordingly, Ag and Ag alloy are preferable because of keeping an excellent electric conductivity in a long time. Examples of Al alloy include magnesium-aluminum alloy (MgAl) and lithium-aluminum alloy (LiAl). Other alloys are also usable such as lithium-magnesium alloy and lithium-indium alloy. Examples of a material of the metal oxide layer include indium tin oxide (ITO) and indium zinc oxide (IZO).

In at least one embodiment, the common electrode 126 has a single-layer structure of the metal layer or the metal oxide layer. Also, in at least one embodiment, the common electrode 126 has a multi-layer structure of the metal oxide layer layered on the metal layer or the metal layer layered on the metal oxide layer.

(10) Sealing Layer 127

A sealing layer 127 is provided on the common electrode 126. The sealing layer 127 has a function of preventing intrusion of impurities such as moisture and oxide from the side opposite to the substrate 100x to the common electrode 126, the electron injection layer 125, the electron transport layer 124, the light emitting layers 123, and the like, thereby suppressing degradation of these layers due to the impurities. The sealing layer 127 includes a light transmissive material such as silicon nitride (SiN) and silicon oxynitride (SiON). In at least one embodiment, a resin sealing layer that includes a resin material such as acrylic resin and silicone resin is provided on a layer that includes a material such as silicon nitride (SiN) and silicon oxynitride (SiON).

In at least one embodiment, since the display panel 10 is of the top-emission type, the sealing layer 127 includes a light transmissive material.

Although not in FIGS. 3A and 3B, in at least one embodiment, a color filter and/or an upper substrate is adhered onto the sealing layer 127 via a sealing resin. Adhesion of an upper substrate helps to prevent the hole injection layers 120, the hole transport layers 121, the light emitting layers 123, the electron transport layer 124, the electron injection layer 125, and the common electrode 126 against moisture, air, and so on.

3. Effect by Display Panel 10 Pertaining to at Least One Embodiment

Figure 10:
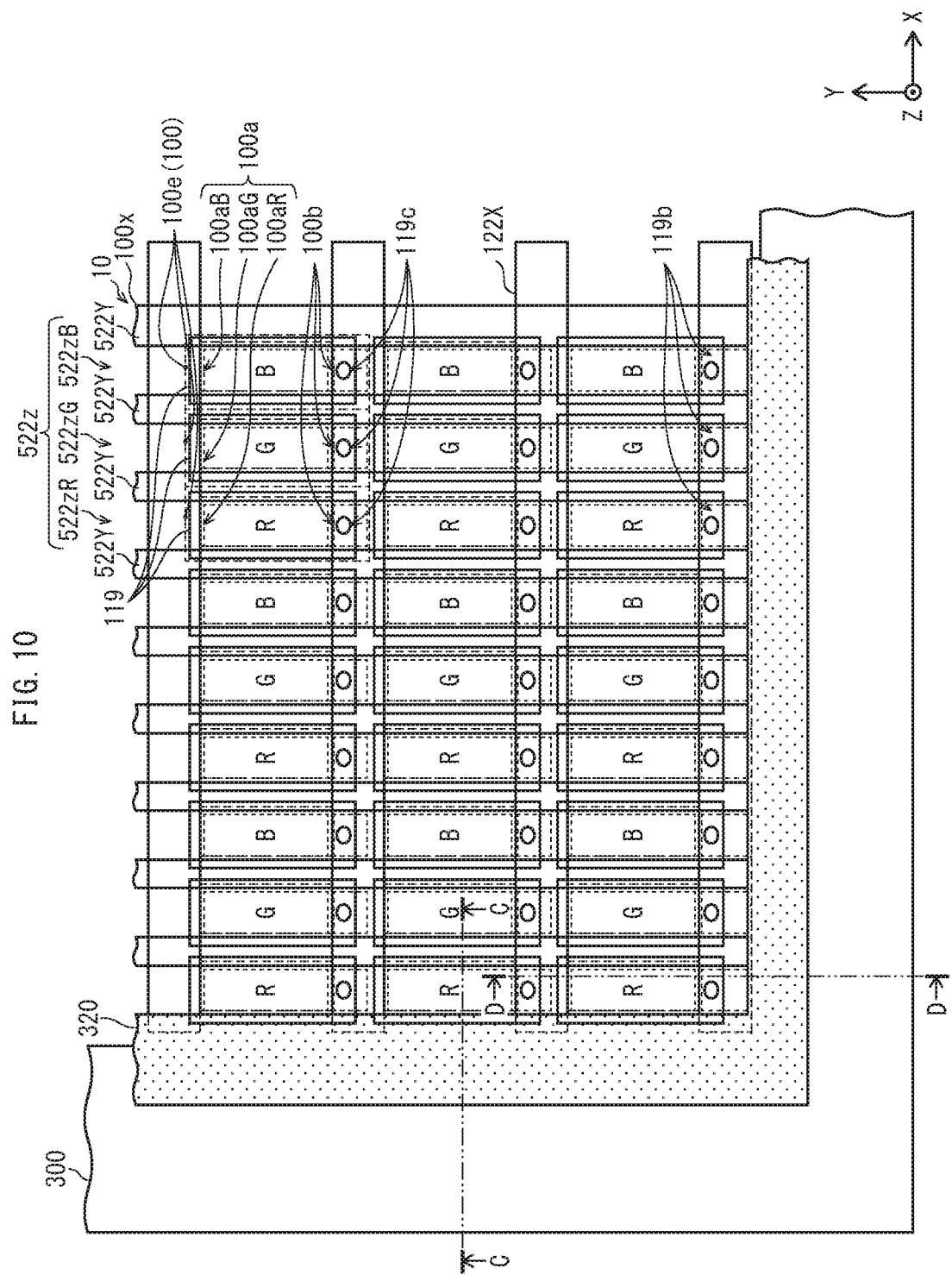
FIG. 10 is a schematic plan view of configuration of a display panel in a comparative example pertaining to at least one embodiment, being similar to FIG. 2.
Figure 11A:
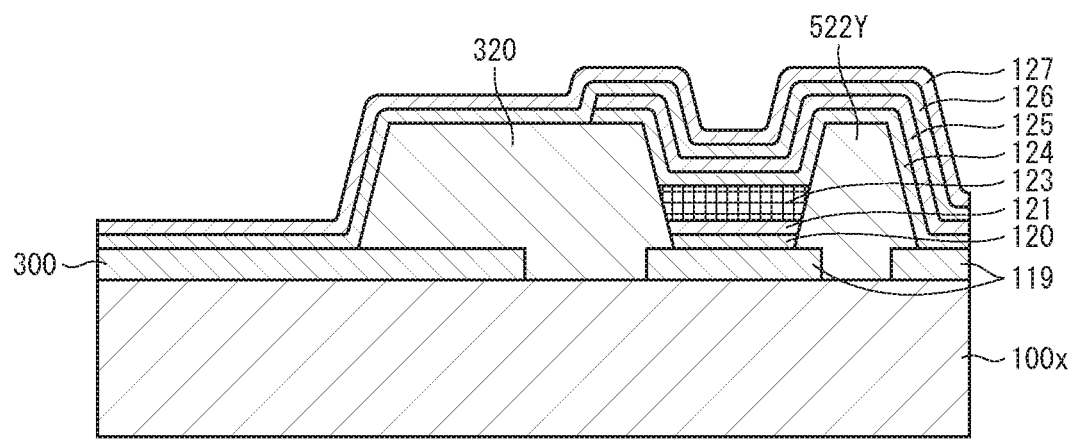
FIGS. 11A and 11B are schematic cross sections respectively taken along lines C-C and D-D in FIG. 10, indicating the configuration of the display panel in the comparative example pertaining to at least one embodiment.
Figure 11B:
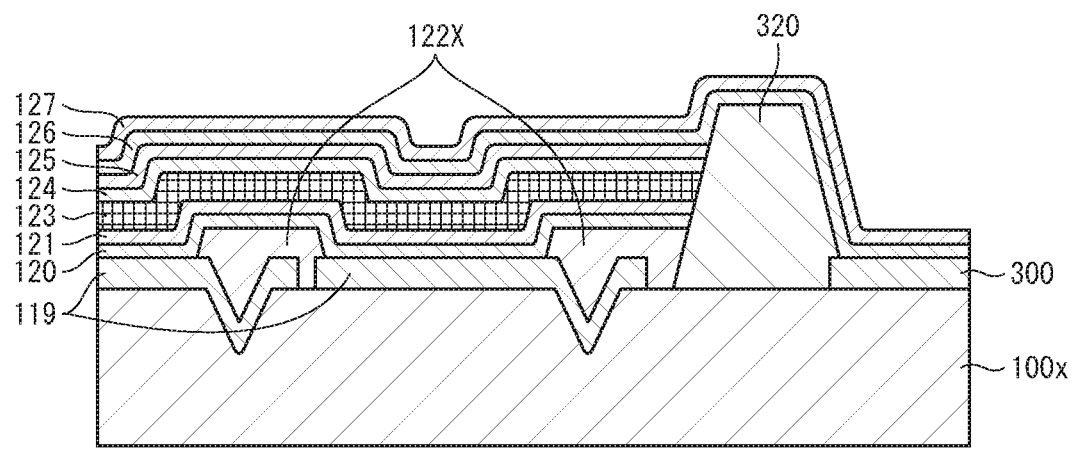

The following describes differences between the display panel 10 having the lyophilic insulating layer 310 pertaining to at least one embodiment and an organic light emitting panel having no lyophilic insulating layer, with reference to the schematic cross sectional views. FIG. 10 is a schematic enlarged plan view of an organic light emitting panel in a comparative example pertaining to at least one embodiment. FIG. 10 indicates, similarly to FIG. 2, the configuration near the boundary between an image display region and a peripheral region. FIGS. 11A and 11B are schematic cross sections respectively taken along lines C-C and D-D in FIG. 10, indicating the configuration of the organic light emitting panel in the comparative example pertaining to at least one embodiment.

In the comparative example in FIG. 10, a liquid-repellent peripheral bank 320 is formed directly on a peripheral electrode 300 with no lyophilic insulating layer therebetween. In the comparative example, an uncured material resist layer is removed by using a developer in a patterning process of the peripheral bank 320 and column banks 522Y. At this time, a common electrode 126 and a sealing layer 127 have not been yet formed. Accordingly, part of a surface part of a peripheral electrode 300 that is not covered with the peripheral bank 320 is exposed to the developer. As described above, since the peripheral bank 320 and the column banks 522Y include fluorine compound for the purpose of exhibiting liquid-repellency, the developer includes fluorine compound. In contrast, the peripheral electrode 300 includes a metal material. Due to this, the exposed surface part of the peripheral electrode 300 reacts with the fluorine compound included in the developer, and thus partially elutes. Especially when such a reaction occurs at the interface between the peripheral bank 320 and the peripheral electrode 300, part of the peripheral electrode 300 that is in contact with the peripheral bank 320 elutes. Thus, a crack is generated at the interface between the peripheral bank 320 and the peripheral electrode 300. As a result, the outer edge of the peripheral bank 320 partially floats up from the peripheral electrode 300, and this greatly decreases the adhesion between the peripheral bank 320 and the peripheral electrode 300. Thus, in an application process of light emitting layers, a so-called color mixture might occur due to ink leakage through gaps generated by the separated the peripheral bank 320. If a developing period in formation of the peripheral bank 320 is reduced, a period during which the surface part of the peripheral electrode 300 is in contact with the developer is accordingly reduced. This resolves the concern about separation between the peripheral bank 320 and the peripheral electrode 300, but raises another concern that sufficient removal of an uncured material resist layer might be impossible. In other words, the comparative example has an antinomy. When corrosion of the surface part of the peripheral electrode 300 is prevented, a defect in formation occurs such as a defect in shape of the peripheral bank 320 and the column banks 522Y and a defect that a liquid-repellent insulating layer is formed in a portion where such an insulating layer is unnecessary.

Compared with this, in the display panel 10 pertaining to at least one embodiment, the lyophilic insulating layer 310 is located between at least the outer edge of the peripheral bank 320 and the peripheral electrode 300. In the display panel 10 pertaining to at least one embodiment as well as the comparative example, in a patterning process of the peripheral bank 320 and the column banks 522Y, an uncured material resist layer is removed by using a developer, and thus a surface part of the peripheral electrode 300 that is not covered with the lyophilic insulating layer 310 is exposed to the developer. However, since the lyophilic insulating layer 310 has a lower percentage of fluorine compound than the peripheral bank 320 or includes no fluorine compound, corrosion of the surface of the peripheral electrode 300 at the interface between the lyophilic insulating layer 310 and the peripheral electrode 300 is prevented. Furthermore, since the lyophilic insulating layer 310 is disposed between the surface of the peripheral electrode 300 and the peripheral bank 320, the developer has, at the interface between the lyophilic insulating layer 310 and the peripheral electrode 300, a low concentration of fluorine compound compared with the case where the lyophilic insulating layer 310 is not provided. This helps to prevent separation of the peripheral bank 320. The inventors made a test for checking whether the peripheral bank 320 separates in extended developing periods in order to validate the effect of preventing separation of the peripheral bank 320. The following table indicates results of the test. Here, the developing period in the table indicates a developing period in formation of the column banks 522 that is defined on the basis of a developing period of 1 that is a period necessary for completely removing resist in the entire surface of a predefined part of self light emitting regions 100a where light emitting layers and so on are to be formed. In the comparative example, little margin was left for the developing period. In the example pertaining to at least one embodiment, in contrast, the peripheral bank 320 did not separate even in a period 1.4 times the developing period.

TABLE 1

|  | Separation | | |
| --- | --- | --- | --- |
| Developing period (a.u.) | 1.0 | 1.1 | 1.4 |
| Example | No | No | No |
| Comparative example | No | Yes | Yes |

Thus, a sufficient developing period is allocated in formation of the peripheral bank 320, the column banks 522Y, and so on. This helps to suppress defects in formation of the peripheral bank 320 and the column banks 522Y due to an insufficient developing period.

4. Manufacturing Method of Display Panel 10

Figure 4:
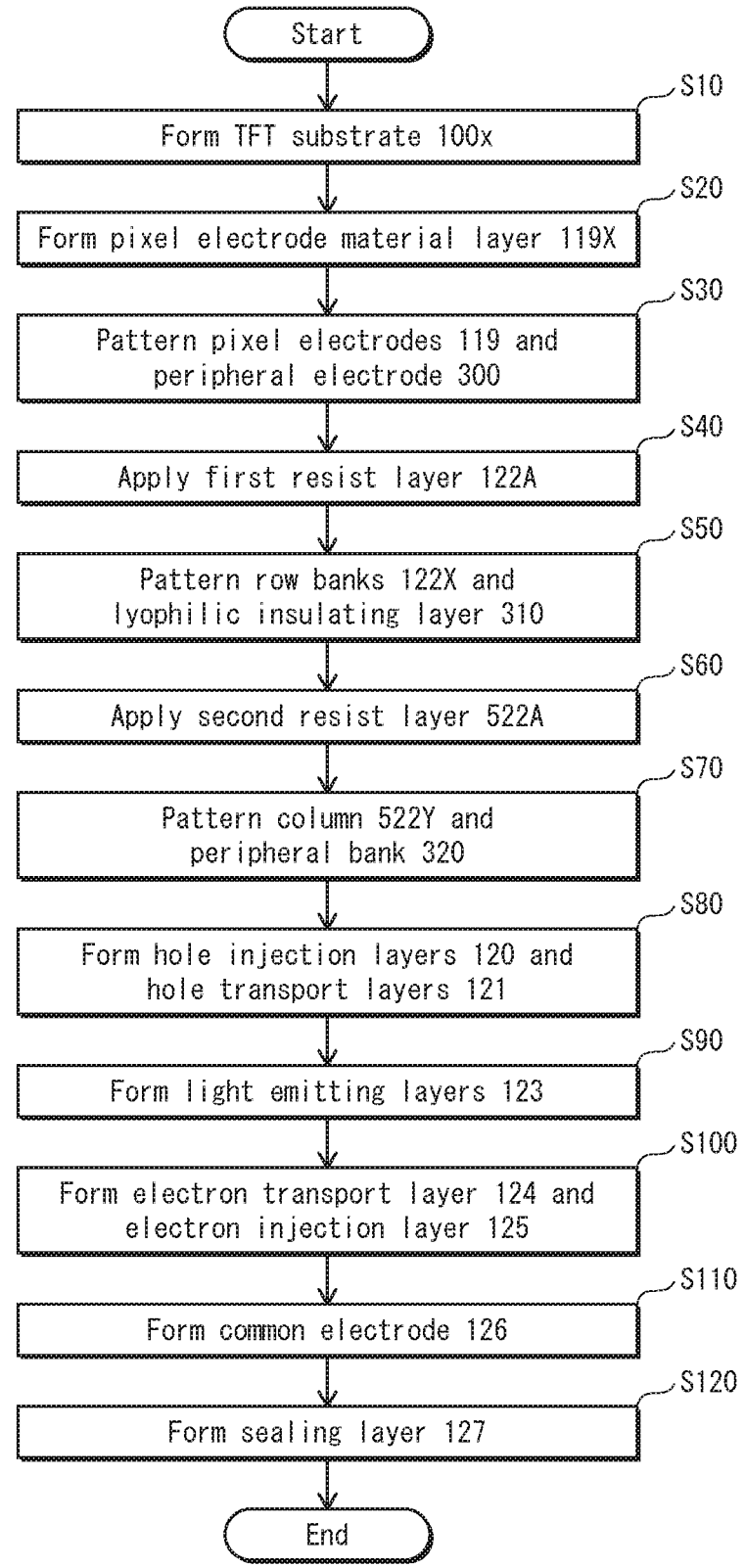
FIG. 4 is a flow chart of a manufacturing method of the display panel 10 pertaining to at least one embodiment.

Next, a manufacturing method of the display panel 10 is described with reference to the drawings. FIGS. 5A to 5E and FIGS. 6A to 6D are schematic cross sections taken along the line A-A in FIG. 2, indicating states of processes in manufacturing of the display panel 10 pertaining to at least one embodiment. FIGS. 7A to 7E and FIGS. 8A to 8D are schematic cross sections taken along the line B-B in FIG. 2, indicating states of processes in manufacturing of the display panel 10 pertaining to at least one embodiment. Also, FIGS. 9A to 9C are schematic plan views indicating states of processes in manufacturing of the display panel 10 pertaining to at least one embodiment. Moreover, FIG. 4 is a flow chart of the manufacturing method of the display panel 10 pertaining to at least one embodiment.

(1) Formation of Substrate 100x

Figure 5A:
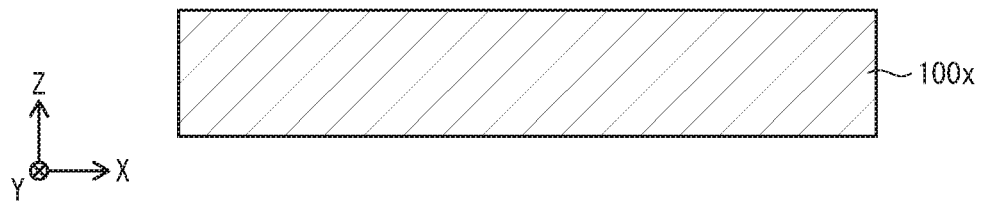
FIGS. 5A to 5E are partial cross sections taken along the line A-A in FIG. 2, indicating part of a manufacturing process of the display panel 10 pertaining to at least one embodiment, where FIG. 5A indicates a state where a substrate is formed, FIG. 5B indicates a state where a pixel electrode material layer is formed on the substrate, FIG. 5C indicates a state where pixel electrodes and a peripheral electrode are formed by patterning the pixel electrode material layer, FIG. 5D indicates a state where a first resist layer is applied onto the pixel electrodes, the peripheral electrode, and an interlayer insulating layer, and FIG. 5E indicates a state where row banks and a lyophilic insulating layer are formed on the pixel electrodes, the peripheral electrode, and the interlayer insulating layer.
Figure 7A:
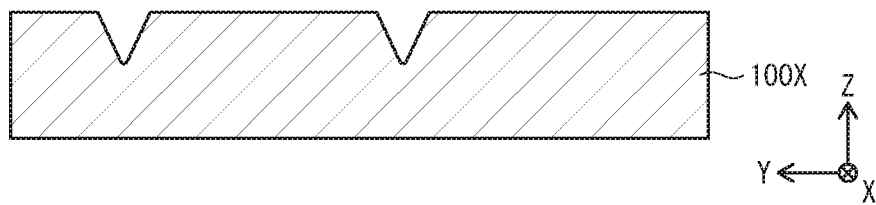
FIGS. 7A to 7E are partial cross sections taken along the line B-B in FIG. 2, indicating part of the manufacturing process of the display panel 10 pertaining to at least one embodiment, where FIG. 7A indicates a state where the substrate is formed, FIG. 7B indicates a state where the pixel electrode material layer is formed on the substrate, FIG. 7C indicates a state where the pixel electrodes and the peripheral electrode are formed by patterning the pixel electrode material layer, FIG. 7D indicates a state where the first resist layer is applied onto the pixel electrodes, the peripheral electrode, and the interlayer insulating layer, and FIG. 7E indicates a state where the row banks and the lyophilic insulating layer are formed on the pixel electrodes, the peripheral electrode, and the interlayer insulating layer.

Firstly, in FIGS. 5A and 7A, a substrate 100x is formed by forming a TFT layer on a base material and forming an interlayer insulating layer on the TFT layer (Step S10). The TFT later is formed by a known TFT manufacturing method. The interlayer insulating layer is formed for example by a plasma CVD method or a sputtering method.

Next, contact holes are provided in the interlayer insulating layer by performing dry-etching so as to be located on parts of source electrodes of the TFT layer. The contact holes are provided such that bottom surfaces of the source electrodes are exposed in bottoms of the contact holes.

Next, connection electrode layers are formed along inner walls of the contact holes. Upper parts of the connection electrode layers are partially disposed on the interlayer insulating layer. The connection electrode layers are formed by forming a metal film for example by the sputtering method, and then patterning the metal film by a photolithography method and a wet etching method.

(1) Formation of Pixel Electrodes 119 and Peripheral Electrode 300

Figure 5B:
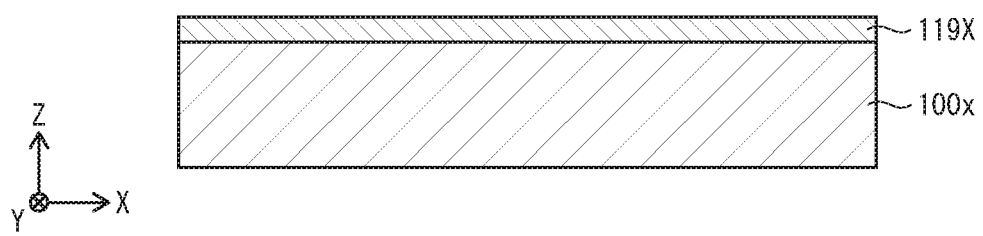
Figure 7B:
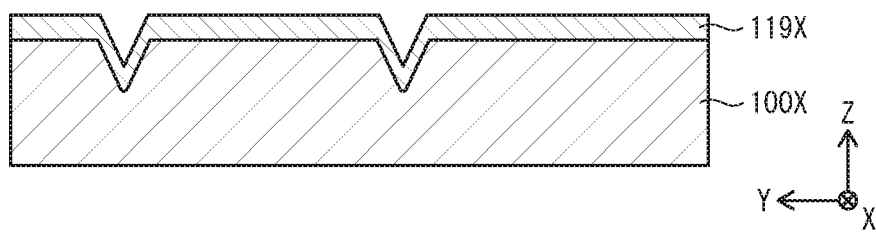

Next, in FIGS. 5B and 7B, a pixel electrode material layer 119X is formed on the substrate 100x (Step S20). The pixel electrode material layer 119X is formed for example by the vacuum deposition method or the sputtering method.

Figure 5C:
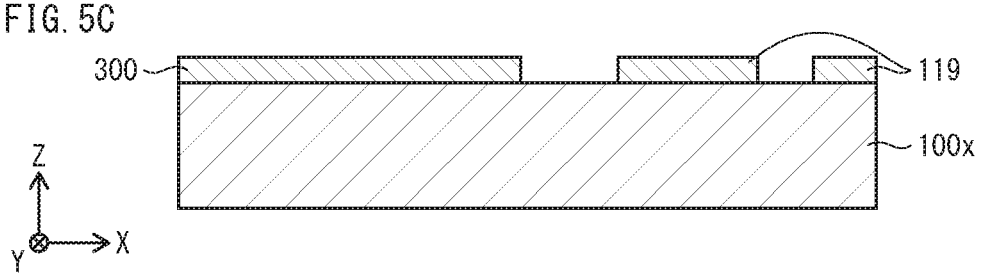
Figure 7C:
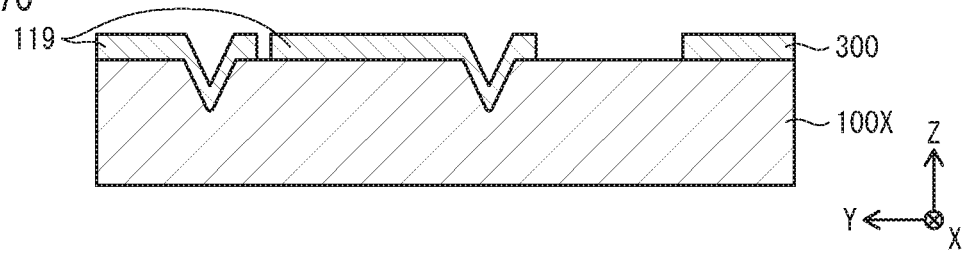

Then, in FIGS. 5C and 7C, pixel electrodes 119 and a peripheral electrode 300 are formed by patterning the pixel electrode material layer 119X by an etching method (Step S30). While the pixel electrodes 119 are located in an image display region 10a so as to be partitioned between sub pixels 100se, the peripheral electrode 300 is located in a peripheral region 10b. A plan view of the pixel electrodes 119 and the peripheral electrode 300 after formation is as in the schematic view of FIG. 9A.

(3) Formation of Row Banks 122X and Lyophilic Insulating Layer 310

Figure 5D:
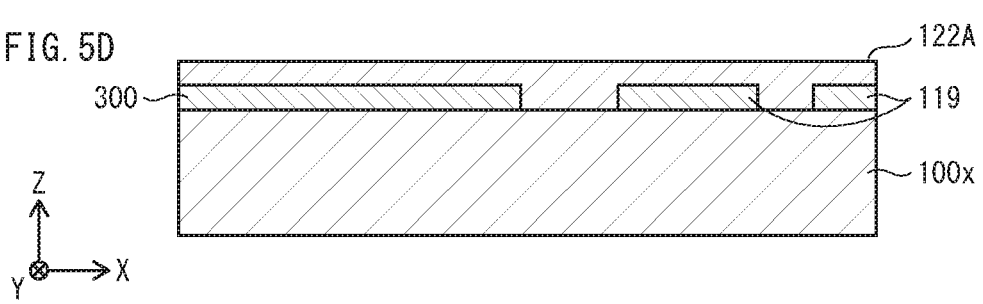
Figure 7D:
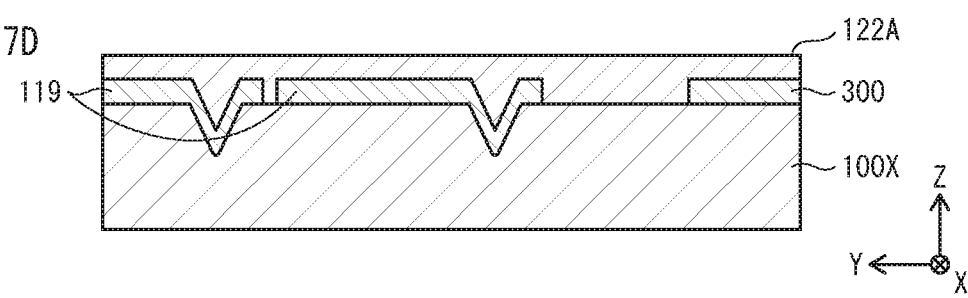

Next, in FIGS. 5D and 7D, a first resist layer 122A is formed by applying photosensitive resin, which is a material of row banks 122X and a lyophilic insulating layer 310, onto the pixel electrodes 119, the peripheral electrode 300, and the substrate 100x (Step S40). The photosensitive resin is for example phenol resin, which is a positive photosensitive material. Specifically, the first resist layer 122A is formed by uniformly applying a solution of phenol resin dissolved in a solvent onto the pixel electrodes 119, the peripheral electrode 300, and the substrate 100x for example by a spin coating method.

Figure 5E:
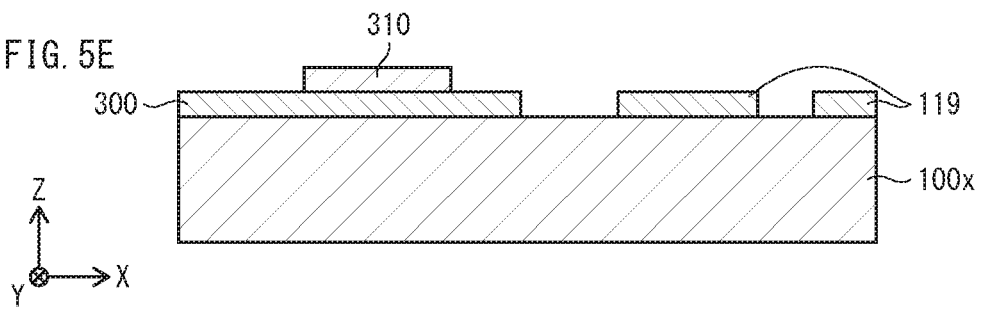
Figure 7E:
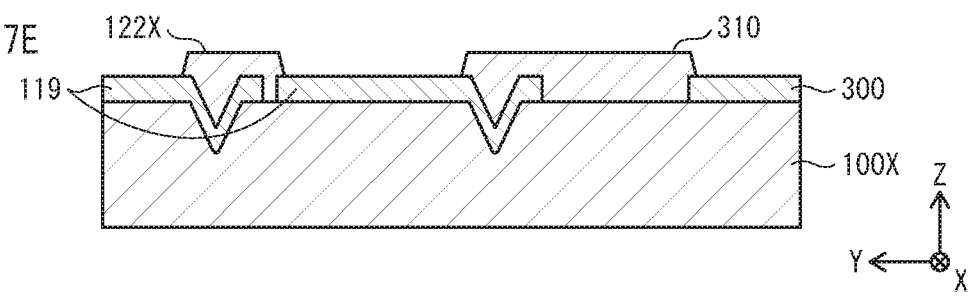

Then, in FIGS. 5E and 7E, the row banks 122X and the lyophilic insulating layer 310 are formed by performing pattern exposure and developing on the first resist layer 122A (Step S50). A plan view of the row banks 122X and the lyophilic insulating layer 310 after formation is as in the schematic view of FIG. 9B. The row banks 122X are formed so as to partially cover each pair of the pixel electrodes 119 adjacent in the column direction and cover the contact holes. In contrast, the lyophilic insulating layer 310 has a frame shape with a predefined width, and is disposed on the peripheral electrode 300 such that the outer edge of the lyophilic insulating layer 310 is located outside the outer edge of a peripheral bank 320. In FIG. 9B, in at least one embodiment, the row banks 122X and the lyophilic insulating layer 310 are continuous without being separated near the boundary between the image display region 10a and the peripheral region 10b.

(4) Formation of Column Banks 522Y and Peripheral Bank 320

Figure 6A:
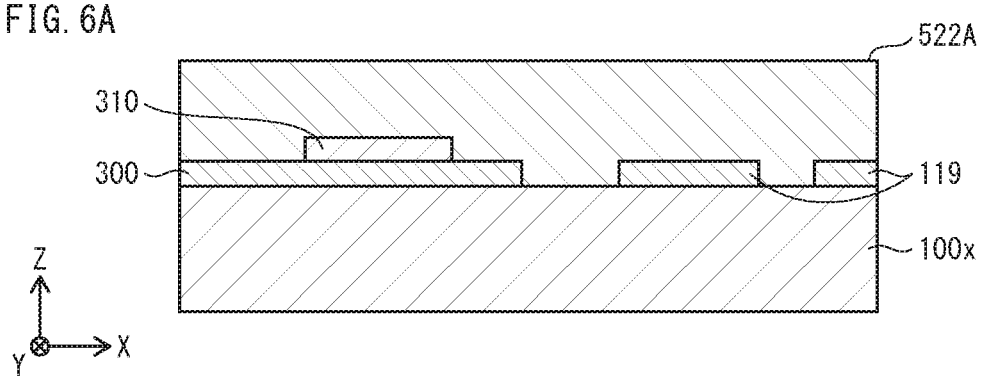
FIGS. 6A to 6D are partial cross sections taken along the line A-A in FIG. 2, indicating part of the manufacturing process of the display panel 10 pertaining to at least one embodiment, where FIG. 6A indicates a state where a second resist layer is applied, FIG. 6B indicates a state where column banks and a peripheral bank are formed, FIG. 6C indicates a state where hole injection layers, hole transport layers, light emitting layers, an electron transport layer, and an electron injection layer are formed in an image display region, and FIG. 6D indicates a state where a common electrode and a sealing layer are formed.
Figure 8A:
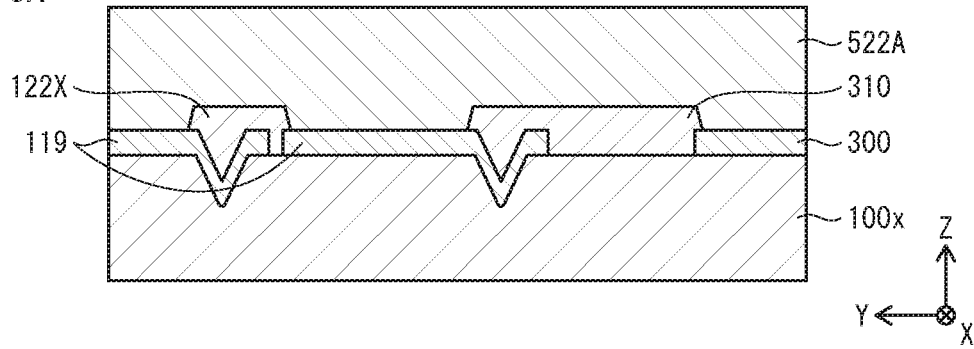
FIGS. 8A to 8D are partial cross sections taken along the line B-B in FIG. 2, indicating part of the manufacturing process of the display panel 10 pertaining to at least one embodiment, where FIG. 8A indicates a state where the second resist layer is applied, FIG. 8B indicates a state where the column banks and the peripheral bank are formed, FIG. 8C indicates a state where the hole injection layers, the hole transport layers, the light emitting layers, the electron transport layer, and the electron injection layer are formed in the image display region, and FIG. 8D indicates a state where the common electrode and the sealing layer are formed.
Figure 9A:
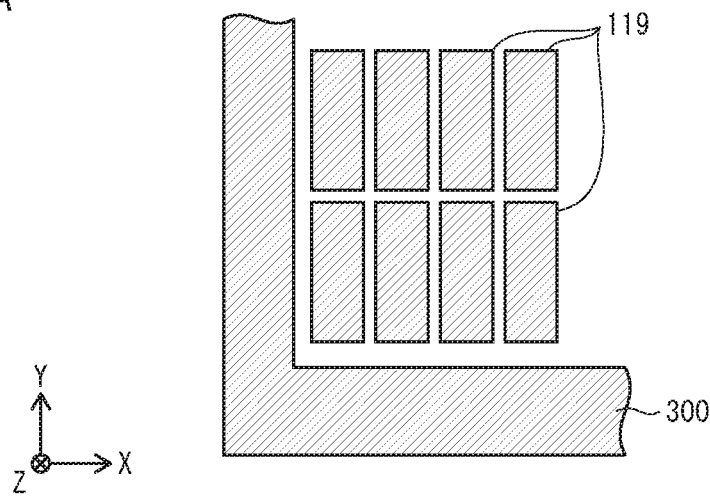
FIGS. 9A to 9C are partial plan view corresponding to FIG. 2, indicating part of the manufacturing process of the display panel 10 pertaining to at least one embodiment, where FIG. 9A indicates a state where the pixel electrodes and the peripheral electrode are formed, FIG. 9B indicates a state where the row banks and the lyophilic insulating layer are formed, and FIG. 9C indicates a state where the column banks and the peripheral bank are formed.
Figure 9B:
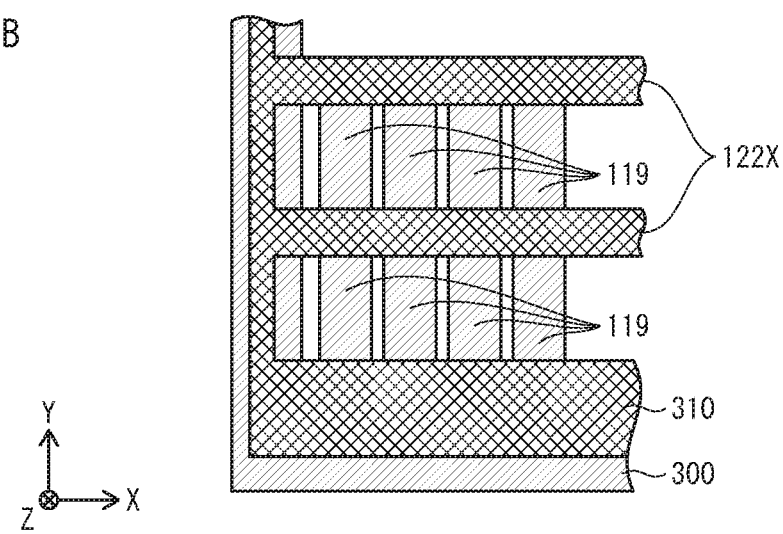
Figure 9C:
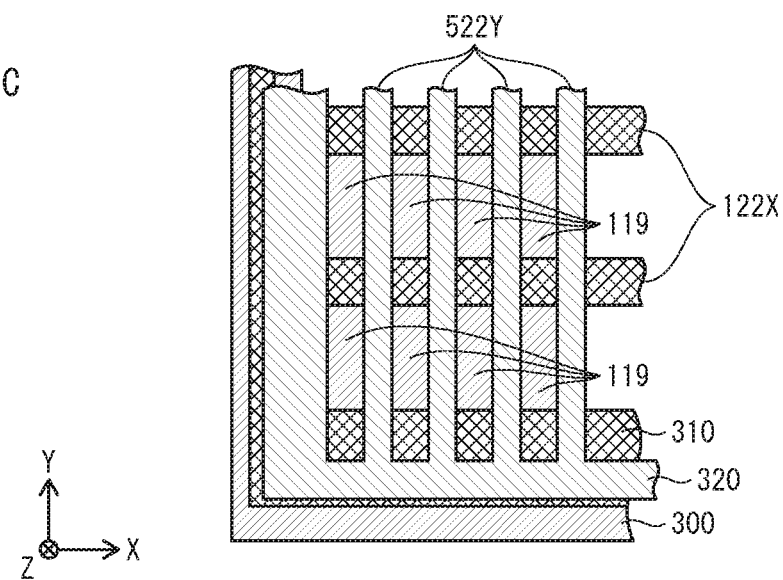

Next, in FIGS. 6A and 8A, a second resist layer 522A is formed by applying photosensitive resin, which is a material of column banks 522Y and the peripheral bank 320, onto the pixel electrodes 119, the peripheral electrode 300, and the substrate 100x (Step S60). The photosensitive resin is for example phenol resin, which is a positive photosensitive material, to which fluorine compound, which is a liquid-repellent surfactant, has been added. Specifically, the second resist layer 522A is formed by uniformly applying a solution of phenol resin dissolved in a solvent onto the pixel electrodes 119, the peripheral electrode 300, and the substrate 100x for example by the spin coating method.

Figure 6B:
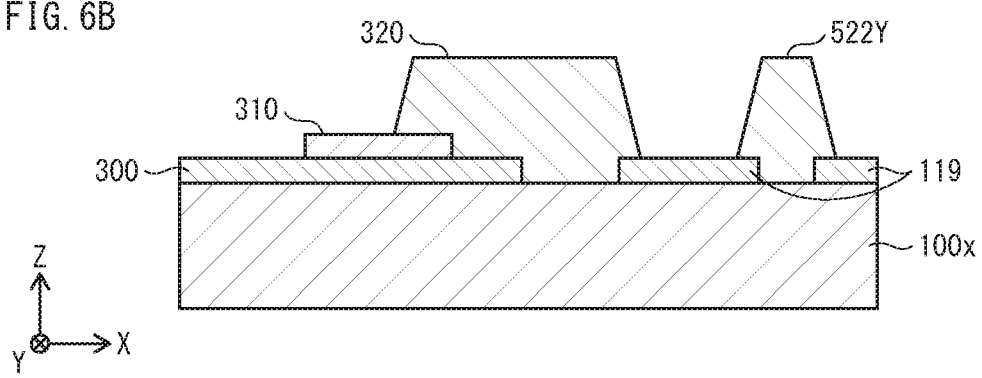
Figure 8B:
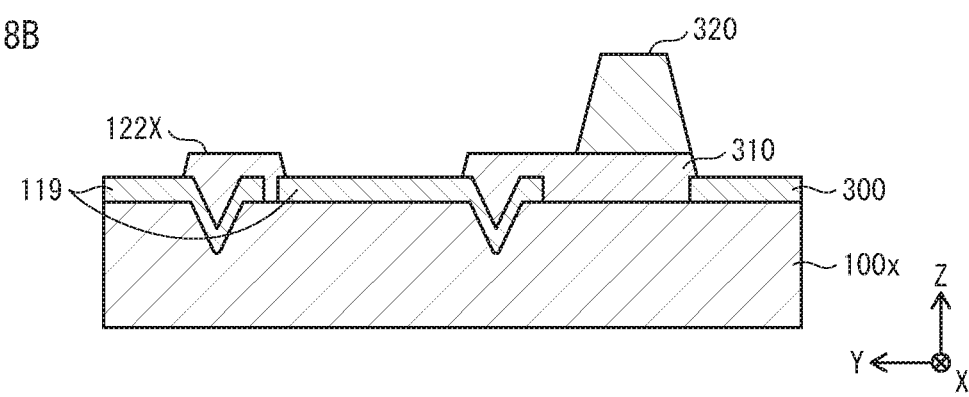

Then, in FIGS. 6B and 8B, the column banks 522Y and the peripheral bank 320 are formed by performing pattern exposure and developing on the second resist layer 522A (Step S70). A plan view of the column banks 522Y and the peripheral bank 320 after formation is as in the schematic view of FIG. 9C. The column banks 522Y are formed so as to partially cover each pair of the pixel electrodes 119 adjacent in the row direction and cover the row banks 122X. In contrast, the peripheral bank 320 has a frame shape with a predefined width, and is disposed on the lyophilic insulating layer 310 such that at least the outer edge of the peripheral bank 320 is located on the lyophilic insulating layer 310. In FIG. 9C, in at least one embodiment, the row banks 122X and the lyophilic insulating layer 310 are continuous without being separated near the boundary between the image display region 10a and the peripheral region 10b.

Lastly, the row banks 122X, the lyophilic insulating layer 310, the column banks 522Y, and the peripheral bank 320 are collectively baked for example at a temperature of 150 degrees C. to 210 degrees C. for 60 minutes.

(5) Formation of Functional Layer

Next, hole injection layers 120 are formed by applying an ink containing material of the hole injection layers 120 to openings which are defined by the row banks 122X and the column banks 522Y and baking (drying) the applied ink. Next, hole transport layers 121 are formed by applying an ink containing material of the hole transport layers 121 onto the hole injection layers 120 in the openings and baking (drying) the applied ink (Step 80).

Next, light emitting layers 123 are formed by applying an ink containing material of the light emitting layers 123 onto the hole transport layers 121 in the openings and baking (drying) the applied ink (Step S90).

Figure 6C:
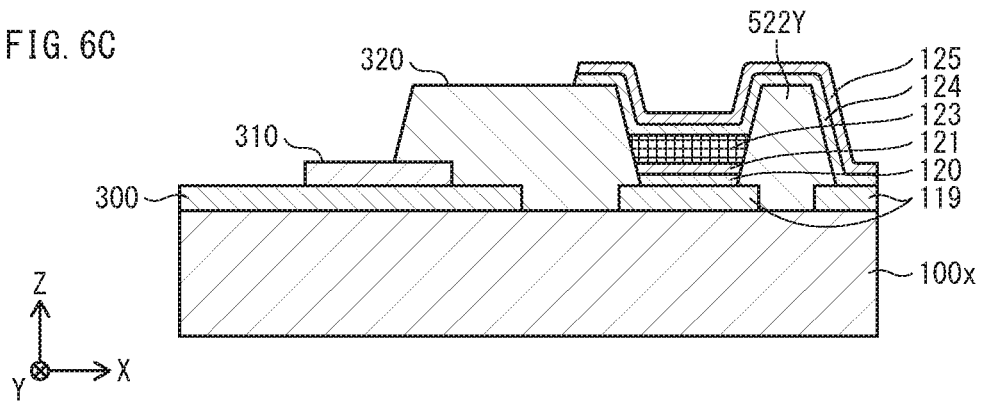
Figure 8C:
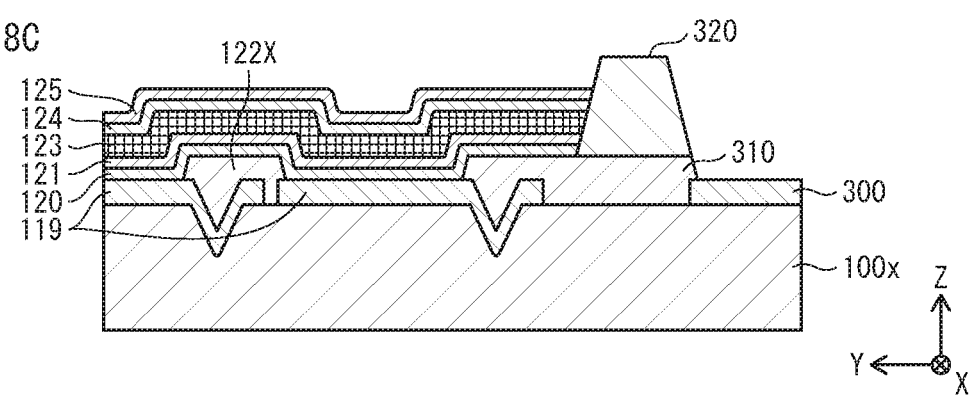

Next, an electron transport layer 124 is formed by forming a film from material of the electron transport layer 124 on the light emitting layers 123, the row banks 122X, and the column banks 522Y over the image display region 10a in common for the sub pixels 100se by the vacuum deposition method or the sputtering method. Next, an electron injection layer 125 is formed by forming a film from material of the electron injection layer 125 on the electron transport layer 124 in common for the sub pixels 100se by the vacuum deposition method, the spin coating method, a cast method, or the like (Step S100). FIGS. 6C and 8C indicate the state of the electron transport layer 124 immediately after formation.

(6) Formation of Common Electrode 126

Next, a common electrode 126 is formed by forming a film from material of the common electrode 126 on the electron injection layer 125, the lyophilic insulating layer 310, the peripheral bank 320, and the peripheral electrode 300 in common for the sub pixels 100se and the peripheral electrode 300 by the vacuum deposition method or the sputtering method (Step S110).

(7) Formation of Sealing Layer 127

Figure 6D:
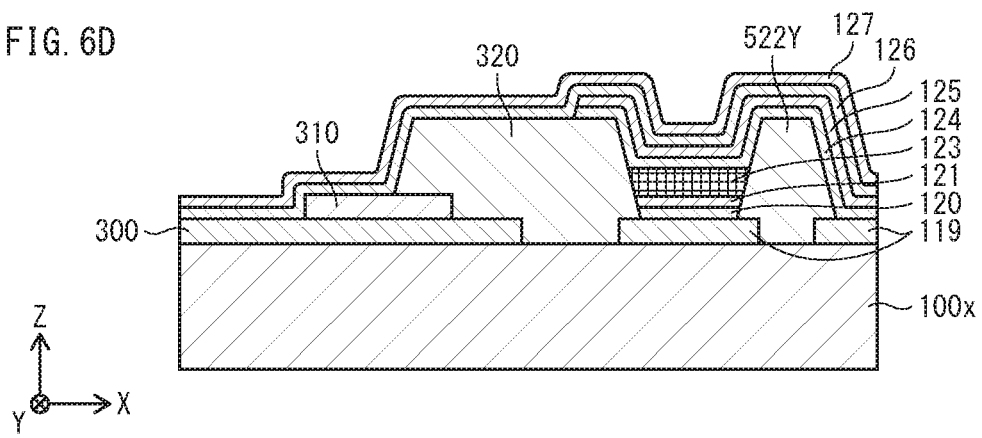
Figure 8D:
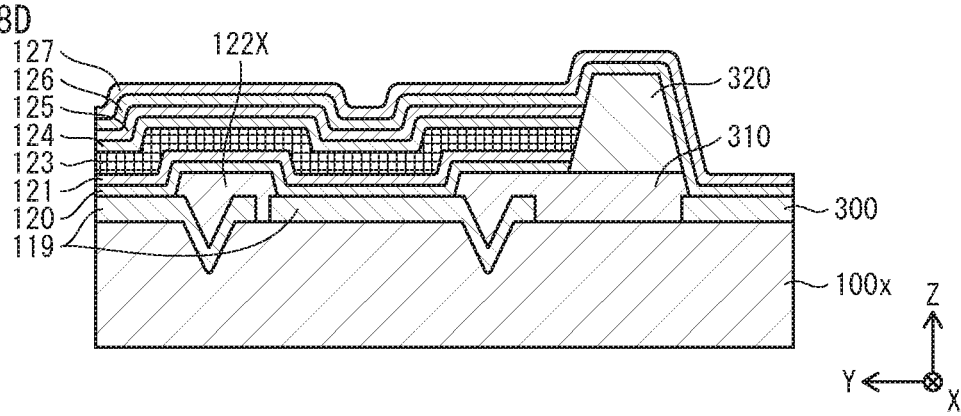

Lastly, in FIGS. 6D and 8D, a sealing layer 127 is formed by forming a film using material of the sealing layer 127 on the common electrode 126 in common for the sub pixels 100se by a CVD method or the sputtering method (Step S120).

The display panel 10 is complete through the above processes.

In at least one embodiment, an upper substrate, and so on are adhered onto the sealing layer 127.

5. Whole Configuration of Organic EL Display Device

Figure 12:
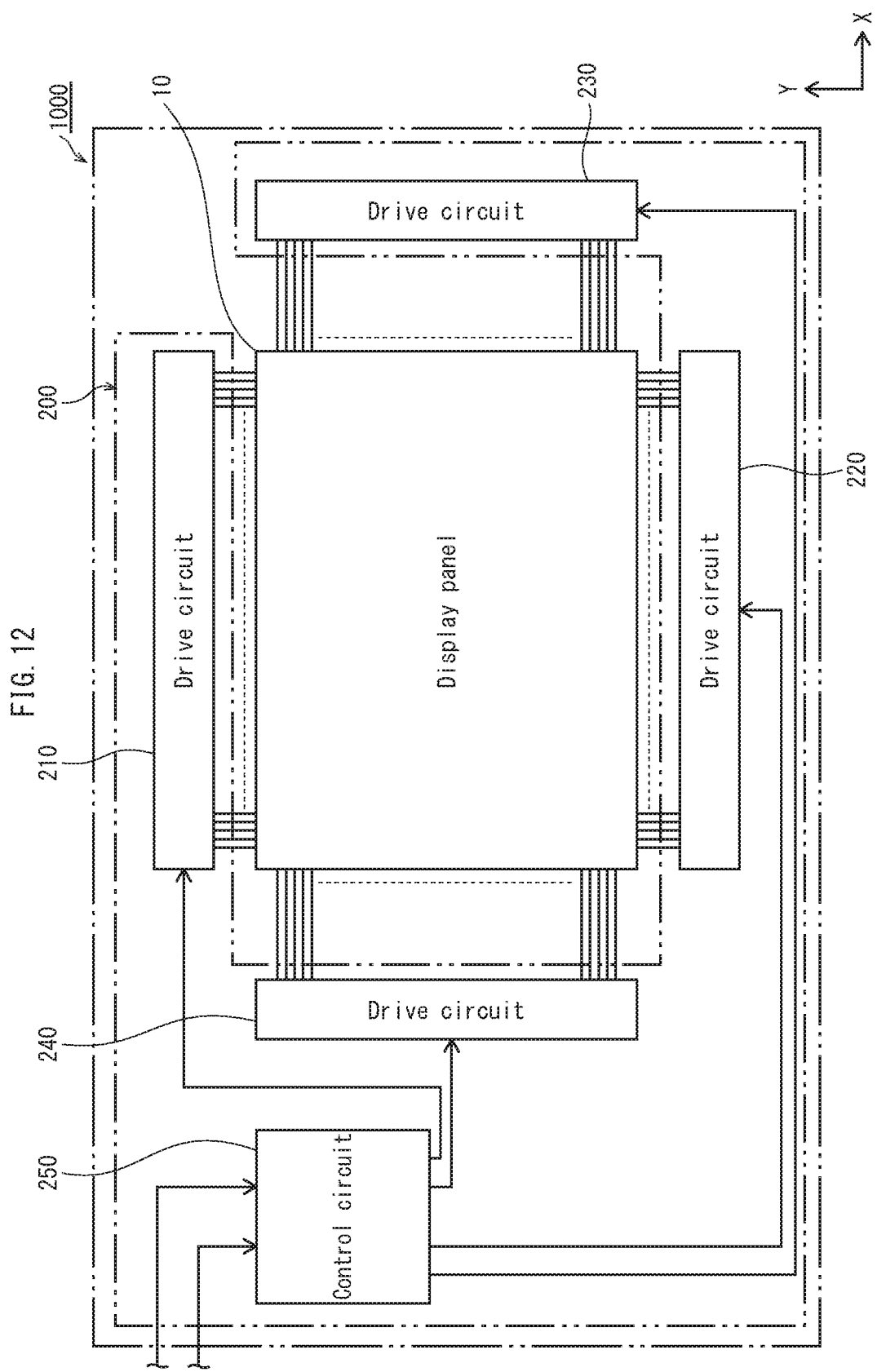
FIG. 12 is a schematic block diagram of configuration of a display device pertaining to at least one embodiment.

FIG. 12 is a schematic block diagram of configuration of an organic EL display device 1000 that includes the display panel 10 pertaining to at least one embodiment. In FIG. 12, the organic EL display device 1000 includes the display panel 10 and a drive control unit 200 that is connected to the display panel 10. The drive control unit 200 includes four drive circuits 210 to 240 and a control circuit 250.

In actual organic EL display devices 1000, the arrangement of the drive control unit 200 relative to the display panel 10 is not limited to the above arrangement.

(1) In at least one embodiment, the lyophilic insulating layer 310 is located both inside and outside the outer edge of the peripheral bank 320 in plan view. Also, in at least one embodiment, the lyophilic insulating layer 310 is interposed between the peripheral electrode 300 and the peripheral bank 320 so as to be disposed immediately below the outer edge of the peripheral bank 320 and a part immediately inside the outer edge and on the peripheral electrode 300 in plan view. For example, the outer edge of the lyophilic insulating layer 310 coincides with the outer edge of the peripheral bank 320 in plan view.

Also, in a peripheral bank developing process, a surface part of the peripheral electrode that is not covered by the peripheral bank is exposed to a developer, and thus elutes. As a result, the peripheral bank separates from the substrate. This phenomenon tends to occur more frequently in a bent part of a bottom surface of the peripheral bank 320 than in a linear part of the bottom surface of the peripheral bank 320, and tends to occur most frequently in a corner part of the bottom surface of the peripheral bank 320. In view of this, in at least one embodiment, the lyophilic insulating layer 310 is interposed between the peripheral electrode 300 and the peripheral bank 320 so as to be disposed immediately below only the bent part of the outer edge of the peripheral bank 320, that is, immediately below at least the corner part of the bottom surface of the peripheral bank 320 and on the peripheral electrode 320.

(2) In at least one embodiment, the peripheral bank 320 is formed so as to surround the image display region with no gap. Also, in at least one embodiment, the peripheral bank 320 has for example a shape like two parallel lines so as to close both ends in the column direction of the image display region 10a (the upper end and the lower end of the image display region 10a in FIG. 1) corresponding to the both ends of the column banks 522Y in the column direction. Furthermore, in at least one embodiment, the peripheral bank 320 for example has a part that is parallel to the column banks 522Y and is partially cut and/or a part that is in contact with the row banks 122X and is partially cut. In this case, the lyophilic insulating layer 310 is interposed between the peripheral electrode 300 and the peripheral bank 320 so as to be disposed immediately below the outer edge of the peripheral bank 320 and on the peripheral electrode 300 in the peripheral region 10b.

Moreover, in at least one embodiment, in the similar manner to the peripheral bank 320, in the case where any bank like the column banks 522Y, such as a bank that is rectangular and partitions dummy pixel regions, is provided in the peripheral region 10b, the lyophilic insulating layer 310 is interposed between the peripheral electrode and the bank so as to be disposed immediately below the outer edge of the bank and on the peripheral electrode 300.

(3) In at least one embodiment, the peripheral electrode 300 is formed so as to surround the image display region 10a with no gap. Also, in at least one embodiment, the peripheral electrode 300 is for example formed along the column banks 522Y only outside the image display region 10a in the row direction (on the left and right sides outside the image display region 10a in FIG. 1). Moreover, in at least one embodiment, the peripheral electrode 300 is formed in separate regions. Also, in at least one embodiment, other electrode is for example be disposed in the peripheral region 10b in addition to the peripheral electrode 300. In the case where a peripheral bank is disposed on the other electrode, the lyophilic insulating layer 310 is interposed between the other electrode and the peripheral bank so as to be disposed immediately below the outer edge of the peripheral bank and on the other electrode.

(4) In at least one embodiment, the pixel electrodes 119 and the peripheral electrode 300 are formed simultaneously by using the same material, the row banks 122X and the lyophilic insulating layer 310 are formed simultaneously by using the same material, and the column banks 522Y and the peripheral bank 320 are formed simultaneously by using the same material. Also, in at least one embodiment, the pixel electrodes 119 and the peripheral electrode 300 are for example formed separately, and/or the column banks 522Y and the peripheral bank 320 are for example formed separately.

(4) In at least one embodiment, the organic EL display panel includes the light emitting layers of three types emitting light of the three colors R, G, and B. Also, in at least one embodiment, the light emitting layers are of two types or four or more types. Here, the types of light emitting layers indicate variation in film thickness of light emitting layers, a functional layer, and the like. Light emitting layers, a functional layer, and the like that emit light of the same color but have different film thicknesses can be regarded as light emitting layers of different types. Also, the arrangement order of the light emitting layers is not limited to RGBRGB. . . . In at least one embodiment, light emitting layers are arranged in the order of RGBBGRRGB. . . . Furthermore, in at least one embodiment, auxiliary electrode layers, other non-luminous regions, etc. are provided between pixels. In at least one embodiment, auxiliary electrode layers are provided so as to be electrically connected with the peripheral electrode 300. Moreover, in at least one embodiment, the auxiliary electrode layers are formed simultaneously with at least one of the pixel electrodes 119 and the peripheral electrode 300 by using the same material as at least one of a material of the pixel electrodes 119 and a material of the peripheral electrode 300.

(5) In at least one embodiment, the hole injection layers 120, the hole transport layers 121, and the light emitting layers 123 in the organic EL elements 100 are all formed by an application method. Also, in at least one embodiment, these layers are formed by other method such as the deposition method and the sputtering method.

Moreover, the organic EL elements 100 do not necessarily need to have the above configuration including the hole injection layers 120, the hole transport layers 121, the electron transport layer 124, and the electron injection layer 125. In at least one embodiment, organic EL elements 100 do not include at least one of these layers. Also, in at least one embodiment, organic EL elements 100 include other functional layer in addition to these layers. Furthermore, in at least one embodiment, the organic EL elements 100 include a single electron injection transport layer instead of the electron transport layer 124 and the electron injection layer 125.

(6) In at least one embodiment, since the display panel 10 is of the top-emission type, the pixel electrodes are light-reflective and the common electrode is light-transmissive. Also, in at least one embodiment, a display panel is of a so-called bottom-emission type.

(7) In at least one embodiment, the display panel 10 includes the organic EL elements 100 of an application type as light emitting elements. Also, in at least one embodiment, the display panel 10 include organic EL elements of a deposition type as light emitting elements. Moreover, the present disclosure is not limited to organic light emitting panels, and may include inorganic light emitting panels having light emitting elements other than organic EL light emitting elements, and non-self light emitting panels such as liquid crystal panels. The present disclosure is effective in the case where display panels include elements that are formed by forming a resist pattern containing fluorine in a wide range on a metal layer that is damaged in developing of photolithography.

Although the technology pertaining to the present disclosure has been fully described by way of examples with reference to the accompanying drawings, it is to be noted that various changes and modifications will be apparent to those skilled in the art. Therefore unless such changes and modifications depart from the scope of the present disclosure, they should be construed as being included therein.

The invention claimed is:

1. A display panel comprising:
   a substrate;
   a light emitting element array that is disposed above the substrate in an image display region;
   a peripheral electrode that is disposed above the substrate in a peripheral region, the peripheral region being located outside the image display region in plan view;
   a lyophilic insulating layer that is disposed on the peripheral electrode; and
   a peripheral bank that includes a liquid-repellent resin material including fluorine, and has an outer edge that overlaps the peripheral electrode in the peripheral region in plan view, wherein
   the lyophilic insulating layer includes a resin material having a lower percentage of fluorine than the peripheral bank, and
   at least a corner part of a bottom surface of the peripheral bank is disposed on the lyophilic insulating layer.

2. The display panel of claim 1, wherein
   the resin material of the lyophilic insulating layer includes no fluorine.

3. The display panel of claim 1, wherein
   the peripheral bank partitions between the image display region and the peripheral region.

4. The display panel of claim 1, wherein
   an outer edge of the lyophilic insulating layer is located outside the outer edge of the peripheral bank in plan view.

5. The display panel of claim 1, wherein
   an outer edge of the lyophilic insulating layer coincides with the outer edge of the peripheral bank in plan view.

6. The display panel of claim 1, wherein
the light emitting element array includes light emitting elements that include pixel electrodes, a functional layer, and a common electrode, and
the peripheral electrode and the pixel electrodes include a same material.

7. The display panel of claim 6, wherein
the peripheral electrode is electrically connected with the common electrode.

8. The display panel of claim 1, wherein
the light emitting element array includes:
light emitting elements that are disposed in a matrix of rows and columns;
column banks that include a liquid-repellent resin material, extend in a column direction, and partition between the light emitting elements in a row direction; and
row banks that include a resin material having a lower liquid repellency than the column banks, and partition between the light emitting elements in the column direction, and
the lyophilic insulating layer and the row banks include a same material.

9. The display panel of claim 8, wherein
the peripheral bank and the column banks include a same material.

10. A display device comprising the display panel of claim 1.

11. A display panel comprising:
a substrate;
a light emitting element array that is disposed above the substrate in an image display region;
a peripheral electrode that is disposed above the substrate in a peripheral region, the peripheral region being located outside the image display region in plan view;
a lyophilic insulating layer that is disposed on the peripheral electrode; and
a peripheral bank that includes a liquid-repellent resin material including fluorine, wherein
the lyophilic insulating layer includes a resin material having a lower percentage of fluorine than the peripheral bank,
a part of an outer edge of the peripheral bank overlaps the peripheral electrode in the peripheral region in plan view, and
at least the part of the outer edge of the peripheral bank is disposed on the lyophilic insulating layer.

12. A method of manufacturing a display panel having an image display region and a peripheral region, the peripheral region being located outside the image display region in plan view, the method comprising:
forming pixel electrodes above a substrate in a range corresponding to the image display region;
forming a peripheral electrode above the substrate in a range corresponding to the peripheral region;
forming a lyophilic insulating layer and row banks by using a photosensitive resin material, wherein the lyophilic insulating layer covers at least an inner edge of the peripheral electrode, and the row banks partition between the pixel electrodes in a column direction;
forming a peripheral bank and column banks by using a photosensitive resin material having a higher percentage of fluorine than the photosensitive resin material of the lyophilic insulating layer, wherein at least a corner part of a bottom surface of the peripheral bank is disposed on the lyophilic insulating layer, and the column banks partition between the pixel electrodes in a row direction;
forming a functional layer above the pixel electrodes; and
forming a common electrode above the functional layer and the peripheral electrode.

13. A method of manufacturing a display panel having an image display region and a peripheral region, the peripheral region being located outside the image display region in plan view, the method comprising:
forming pixel electrodes above a substrate in a range corresponding to the image display region;
forming a peripheral electrode above the substrate in a range corresponding to the peripheral region;
forming a lyophilic insulating layer and row banks by using a photosensitive resin material, wherein the lyophilic insulating layer covers at least an inner edge of the peripheral electrode, and the row banks partition between the pixel electrodes in a column direction;
forming a peripheral bank and column banks by using a photosensitive resin material having a higher percentage of fluorine than the photosensitive resin material of the lyophilic insulating layer, wherein an outer edge of the peripheral bank is located inside an outer edge of the lyophilic insulating layer, and the column banks partition between the pixel electrodes in a row direction;
forming a functional layer above the pixel electrodes; and
forming a common electrode above the functional layer and the peripheral electrode.

* * * * *